United States Patent [19]

Leach

[11] Patent Number: 4,491,938
[45] Date of Patent: Jan. 1, 1985

[54] LOW VOLTAGE RAM CELL

[75] Inventor: Jerald G. Leach, Houston, Tex.

[73] Assignee: Texas Instruments Incorporated, Dallas, Tex.

[21] Appl. No.: 334,852

[22] Filed: Dec. 28, 1981

[51] Int. Cl.³ ............................................. G11C 11/40
[52] U.S. Cl. .................................. 365/222; 365/149; 357/23
[58] Field of Search .......................... 365/149, 222; 307/238.3; 357/23 C

[56] References Cited

U.S. PATENT DOCUMENTS 4,291,393 9/1981 Wilson ............................ 365/222 X Primary Examiner—Joseph A. Popek
Attorney, Agent, or Firm—Melvin Sharp; Richard L. Donaldson; Thomas E. Tyson

[57] ABSTRACT

A memory cell includes a gated capacitor connected to a first node and also connected to a refresh line. The memory cell further includes a transistor that is also connected to the first node and to a second node with the gate terminal being connected to a second refresh line. The second node is connected to the bit line used to access the bit information contained in the cell. A second transistor is included that has one side connected to a power line, the second side connected to the second node and the gate terminal connected to the first node. A first refresh signal is provided on the refresh line connected to the gated capacitor and a second refresh signal is provided to the gate of the first transistor. The second refresh signal is of a voltage magnitude greater than the voltage provided on the power line and the second refresh signal is also provided at a time during which the first refresh signal is absent. Also provided is a semiconductor capacitor that includes the region of a first plurality located in a semiconductor substrate of opposite plurality with a layer of silicon dioxide located on top of the region and on an area adjacent to this region. A metal layer is located on top of the silicon dioxide layer and adjacent to a gap which is made up of the first plurality type and located in the semiconductor substrate and adjacent to the region of first plurality together with being adjacent to the metal layer.

8 Claims, 43 Drawing Figures

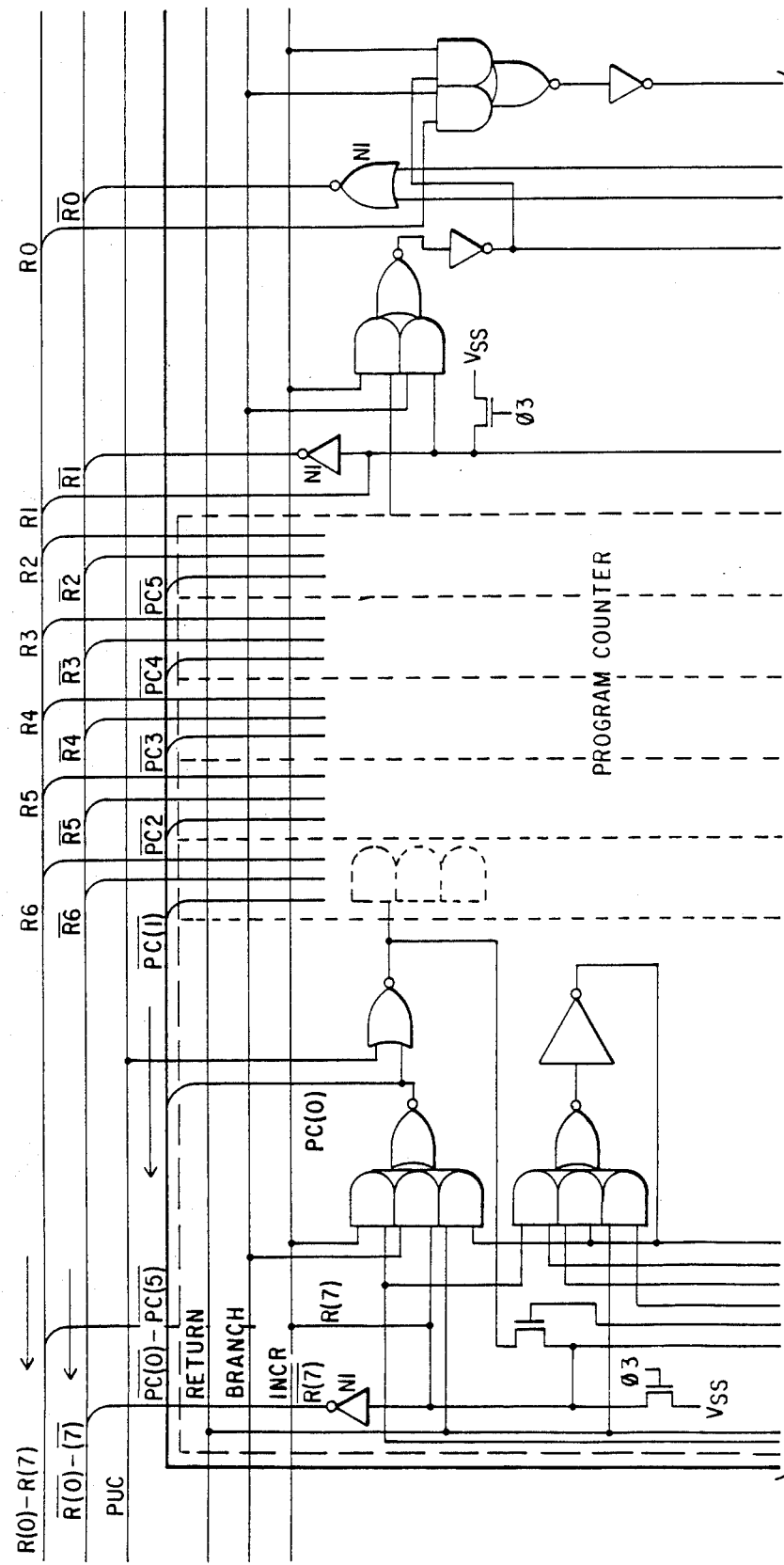

LOW VOLTAGE RAM CELL

RELATED APPLICATIONS

U.S. Patent applications that are related to the present application include U.S. Patent Ser. No. 335,028 entitled, "Low Power Circuit for Microcomputer", U.S. Patent Ser. No. 335,029 entitled, "Low Voltage Display Circuit", U.S. patent application Ser. No. 334,486 entitled, "Low Power Clock Generator Circuit", U.S. patent application Ser. No. 334,487 entitled "Low Power Oscillator Circuit", and U.S. patent application Ser. No. 334,850 entitled "Integrated On/Off Switch".

BACKGROUND

1. Field of the Invention

This invention relates to digital processing circuitry and more particularly to low power circuits for digital processing.

2. Prior Art

Electronic calculator systems of the type having all the main electronic functions within a single, large scaled integrated (LSI) semiconductor chip or small numbers of chips are described in the following prior applications or patents assigned to Texas Instruments Incorporated:

U.S. Pat. No. 3,819,921 by Kilby et al for "Miniature electronic Calculator", based on an application originally filed Sept. 29, 1967;

U.S. Pat. No. 4,074,351 by Boone and Cochran for "Variable Function Program Calculator";

U.S. Pat. No. 3,819,957 by Bryant for "Digital Mask Logic in Electronic Calculator Chip"; and U.S. Pat. No. 3,987,416 by Vandierendonck Fisher and Hartsell for "Electronic Calculator With Display and Keyboard Scanning".

These prior inventions made possible vast reductions in cost and size and increases in functions of electronic calculators. Many millions of such calculators have been produced. The efforts to reduce manufacturing costs and increase the functions available to the user are continuing. Particularly, it is desired to provide a basic chip structure that is quite versatile and can be used for many different types of calculators and similar digital processing equipment. This permits a single manufacturing facility to produce a large quantity of the same devices, differing only in a single mask change, and to produce a dozen variations while still maintaining large volume cost advantages.

The previous MOS/LSI calculator chips as referred to above were generally register organized in that a single instruction word operated on all of the digits in a given register. A more versatile approach is to make the machine digit organized, operating on one digit at a time. For example, it may be desired to test or set a particular one bit flag. In a register machine, an entire 13 digit register must be addressed and mask to implement this, whereas a digit organized machine may access only the needed digit or bit. An example of such a processing chip is disclosed in U.S. Pat. No. 3,991,305 by Caudel et al entitled, "Electronic Calculator or Digital Processor Chip with Multiple Code Combinations of Display and Keyboard Scan Outputs". This patent discloses what is commonly known in industry as the TMS 1000 architecture for a 4 bit microcomputer. Another approach using this same type of architecture is disclosed in U.S. Patent application Ser. No. 216,113 entitled, "Dual Register Digital Processor System" by Koeppen, Rogers, Solimeno and Brown. The architecture of disclosed herein is similar to these TMS 1000 architecture and the architecture disclosed in the above applications implemented with low power circuitry.

FIG. 1A illustrates the prior art attempt at low power operation using positive channel MOS field effect transistor devices. This type of circuit is referred to as precharge and conditional discharge circuitry. The node 800 becomes charged during Phi 3. It should be noted that since the circuitry is presented in P-MOS, the devices are active during the negative portions of the timing signals. This node remains charged until conditionally discharged by the input line during Phi 1. If the input line remains high, then the node will remain charged and the output will remain a −V as shown in FIG. 1B. However, if the input is low thus activating device 801, the node 800 will be discharged during phi 1 as shown. The disadvantage to this standard precharge discharge logic is that the precharge period can cause problems in other circuits, such as in addressing RAM cells. If the precharge discharge is connected directly in the addressing portion of the RAM cell, all the addresses are ON during the precharge time. Therefore, if precharge discharge logic is to be used to address a RAM, additional circuitry is required to buffer the precharge intervals from the addressing lines of the RAM cells.

FIG. 2 illustrates a static inverter which includes a device with the depleted region 802 to provide charge at the node connected to the output line. The static inverter removes the precharge problem, however, the static inverter also consumes a larger amount of d.c. current. A static inverter also requires that the size of the load device to be much larger than any of the devices in the precharge discharge circuitry. This is a disadvantage when fabricating the circuitry on a small silicon chip.

A third approach to the low power circuit operation is shown in FIG. 3, which is a complementary MOS inverter. The clocked CMOS inverter does not have precharges and does not require constant d.c. current. However, the CMOS fabrication process is more expensive and more complex than a normal PMOS or NMOS fabrication process.

The low power approach to many semiconductor display applications has included the use of CMOS, precharge/discharge and static devices. Once such application is curcuitry required for liquid crystal displays. Liquid crystal displays require low amounts of power and thus interface well with low power processing circuitry. A reference for liquid crystal display requirements is the *International Handbook of Liquid Crystal Displays* 1975-76, Second Edition, with 1976 Supplement by Martin Tobias, published by Ovum Ltd. 14 Pen Road, London, NC 9RD, England. Another reference is "General Information on Liquid Crystal Display", published by Epson America, Incorporated, 2990 West Lomita Boulevard, Tolerance, Californai. A third reference is an article entitled, "Liquid Crystal Displays" by L. A. Goodman, printed in the *Journal of Vacuum Science and Technology*, Vol. 10, No. 5, September/October 1973.

In the past, the LCD devices have required the use of low power circuitry such as the precharge discharge logic, or CMOS logic. This specification discloses another alternative, low power circuit that makes possible a low power interface to LCD's without the disadvantages of the two prior art circuits.

This specification also discloses a low voltage RAM cell. RAM cells are included in the prior named patents. However, this specification describes a technique to fabricate a low voltage RAM cell.

Other patents including similar techniques are U.S. Pat. No. 4,061,506 entitled "Correcting Doping Defects" by McElroy and U.S. Pat. No. 4,280,271 entitled "Three Level Interconnect Process for Manufacture of Integrated Circuit Devices" by Lou, Ponder and Tubbs.

In past calculators and microcomputer chips, low power CMOS circuitry or static logic have been used to fabricate oscillators in clock circuitry. This specification discloses a technique to fabricate low power oscillator circuitry without the disadvantage of precharge discharge circuitry, static converters and CMOS circuitry.

Also included in this specification is a description of an integrated circuit ON/OFF switch. The prior art for ON/OFF switches includes the mechanical ON/OFF switch which requirs a separate switch dedicated to power switching. The advantage of an integrated ON/OFF switch is that the integrated ON/OFF switch is included in the keyboard and can also be used for other functions. Except for CMOS ON/OFF switches, prior ON/OFF switches have required a constant current flow of a significant degree thus reducing battery life of battery operated microcomputer systems. The disclosed integrated ON/OFF switch requires an insignificant amount of power while in the OFF state without CMOS fabrication.

SUMMARY OF THE INVENTION

In accordance with the present invention, a memory cell is provided that includes a gated capacitor with one terminal connected to a first node and a second terminal connected to a first refresh line together with a first transistor that has a first terminal connected to the first node and a second terminal connected to a second node. The third terminal of the first transistor is connected to a second refresh line. A bit line is connected to the second node. The memory cell further includes a second transistor with a first terminal connected to a power line and a second terminal connected to the second node. The third terminal of a second transistor is connected to the first node. The first refresh signal is provided to the first refresh line and a second refresh signal is provided to the second refresh line. The second refresh signal is of a voltage magnitude that is greater than the first refresh signal and is greater than the magnitude of the power on the power line. In addition, the second refresh signal is provided at a time when the first refresh signal is not occurring.

Also in accordance with this invention, a semiconductor capacitor is provided that includes a region of a first plurality located in the semiconductor substrate of opposite plurality. On top of this region, a layer of silicon dioxide is located and is further located upon an area that is adjacent to this region. A metal layer is located on top of the silicon dioxide layer and adjacent to a gap. The gap is formed in the semiconductor substrate and is made up of a metal of first plurality. The gap is further located adjacent to the region of first plurality on one side and one the other side, adjacent to the metal layer. The specification further includes a method to form this capacitor.

In one embodiment of this invention, the capacitor is formed by diffusing a region of one plurality into a semiconductor substrate of an opposite plurality. A layer of silicon dioxide is then formed upon the region and on an area adjacent to the region. A metal layer is then formed over a portion of the silicon dioxide layer but is spaced from the region by a gap. The gap is formed by implanting an impurity of the first plurality type into the region and an area adjacent to the region to bridge the gap. The gap does not extend underneath the metal layer because the metal layer acts as a mask to the ion implantation.

BRIEF DESCRIPTION OF THE DRAWINGS

FIG. 4a is a schematic diagram of a low power MOS inverter.

FIG. 4b is a symbolic diagram of the low power MOS circuit shown in FIG. 4a.

FIG. 4c is a timing diagram of the low power MOS circuit in FIG. 4a.

DETAILED DESCRIPTION OF THE INVENTION

Figures 4A, 4B:
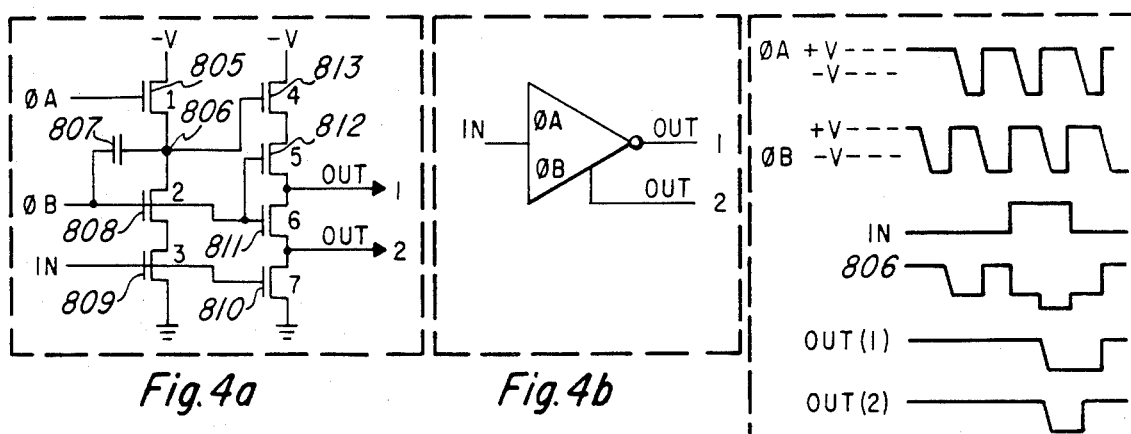
Figure 4C:
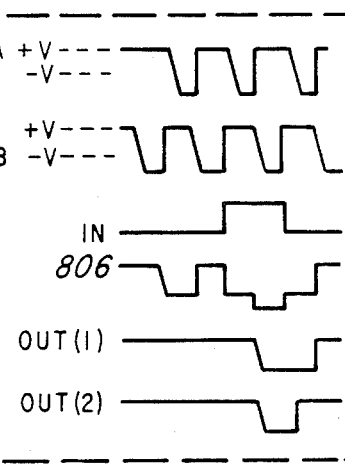

FIG. 4A is the schematic drawing of the basic low power inverter. The symbol for this circuitry in FIG. 4A is shown in FIG. 4B. Timing diagrams for this circuitry are shown in FIG. 4C. Referring to FIG. 4A, the node 806 is charged during the time fame phi A by device 805. During phi B, the node 806 is discharged by the input line and device 809 if the input is low for PMOS circuitry. If, however, the input is high, then the timing signal phi B provides an additional charge through capacitor 807 to node 806. Node 806 turns on device 813 if charged and phi B likewise turns on devices 811 and 812. If the input is high thus not turning on device 810, the lines marked "out 1" and "out 2" produce an output voltage of $-V$ as shown. It should also be noted that node 806 produces a voltage that is below $-V$ since node 806 receives charge from $-V$ or the negative rail, plus charge from the clocking phase phi B through capacitor 807. Therefore the voltage at node 806 is greater than $-V$ as shown in FIG. 4A. This type of circuitry results in a low power inverter without the use of precharge/discharge logic or static inverters. In addition, all the devices shown in FIG. 4A may be fabricated in a PMOS structure as small devices.

Figure 5:
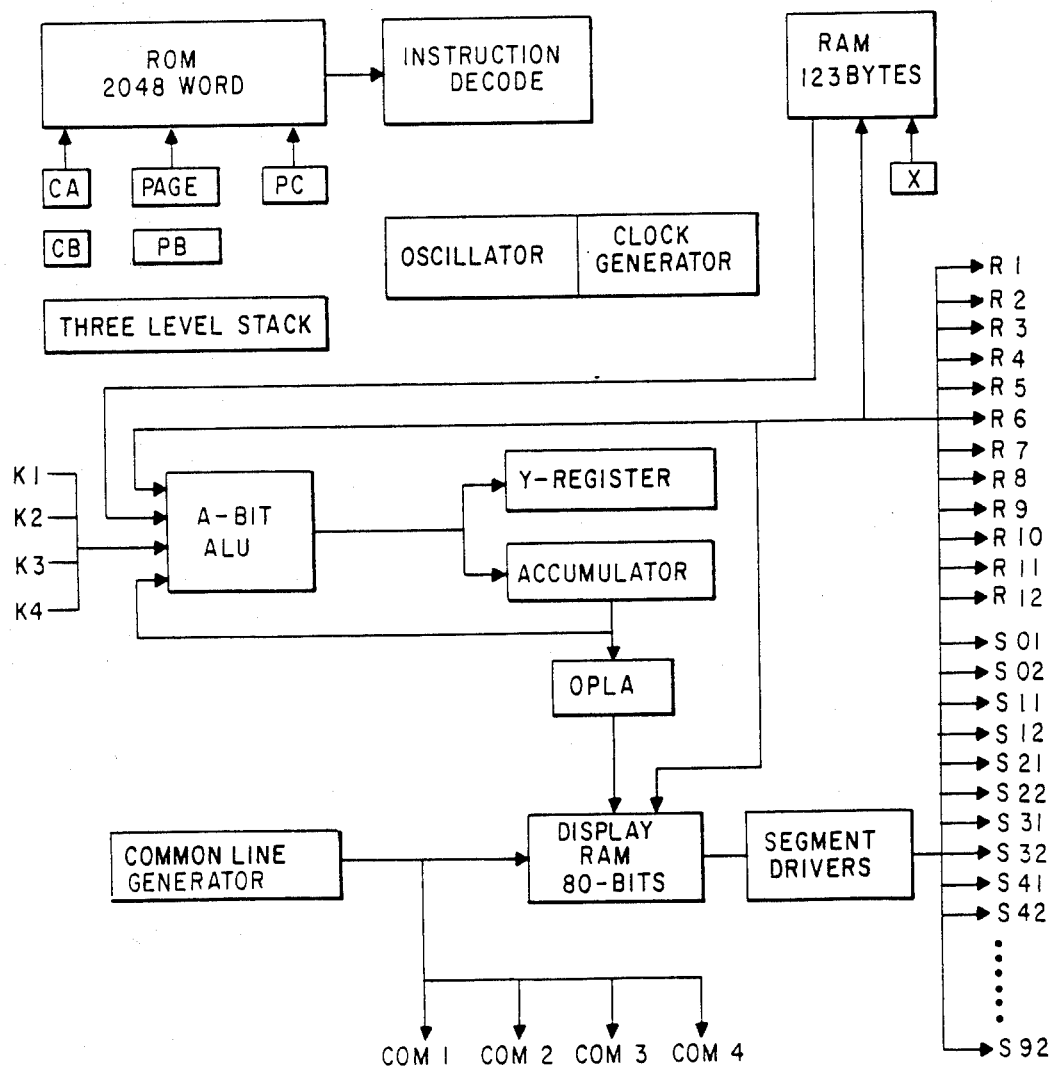
FIG. 5 is a block diagram of a microcomputer using low power MOS circuitry.
Figure 6A:
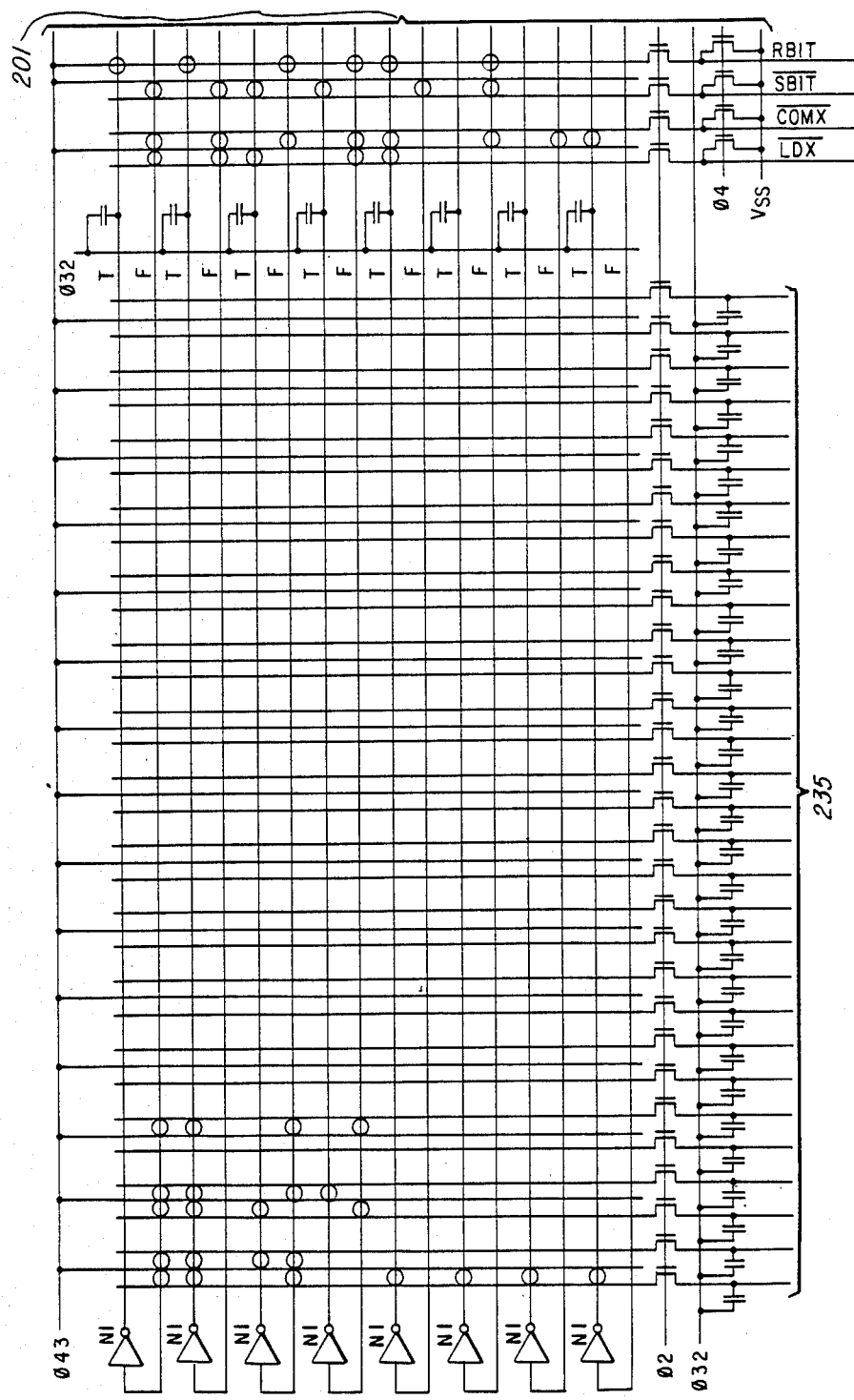
FIG. 6a is a schematic of the instruction decode program logic array.
Figure 6B:
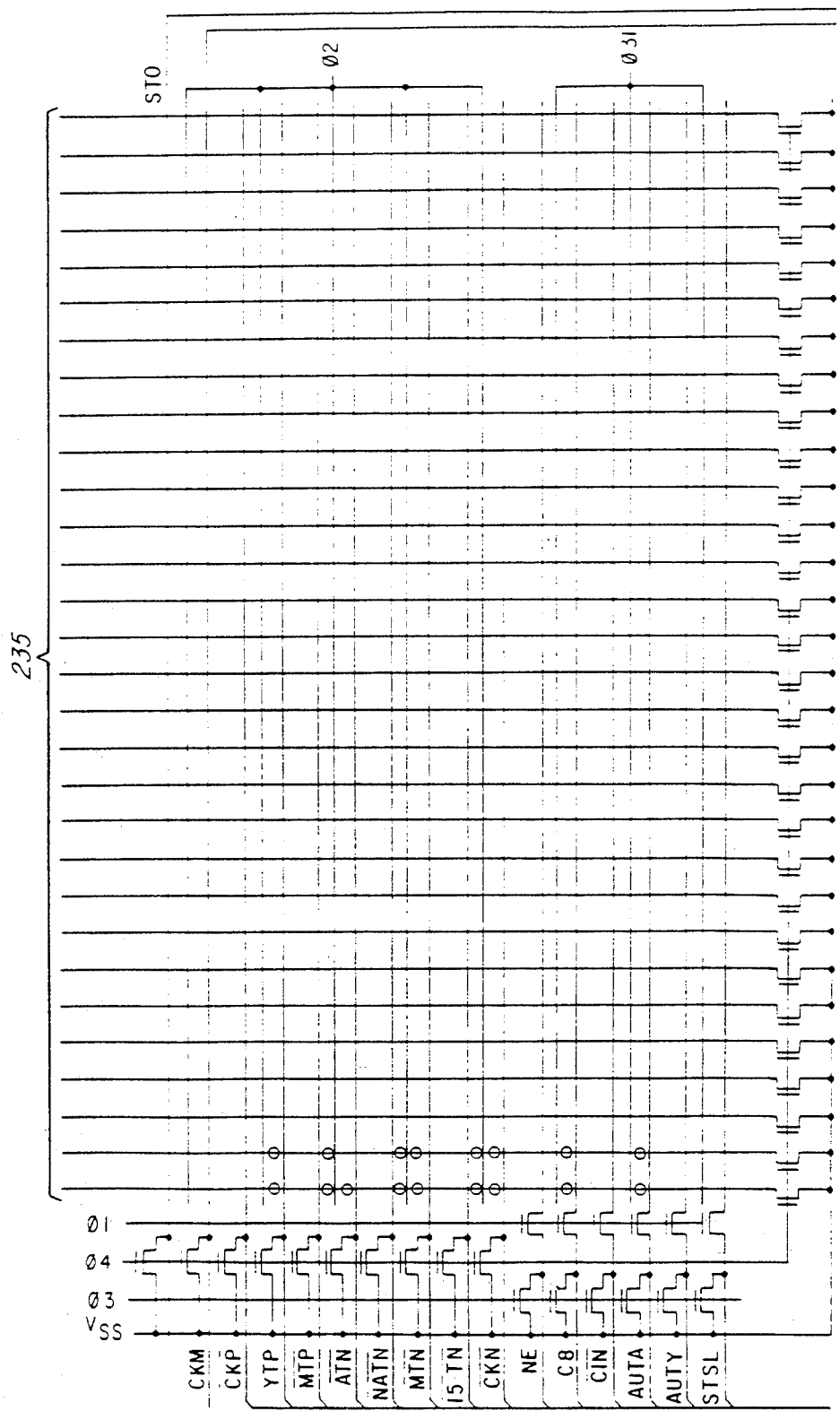
FIG. 6b is a schematic diagram of additional instruction decode logic.
Figure 6C:
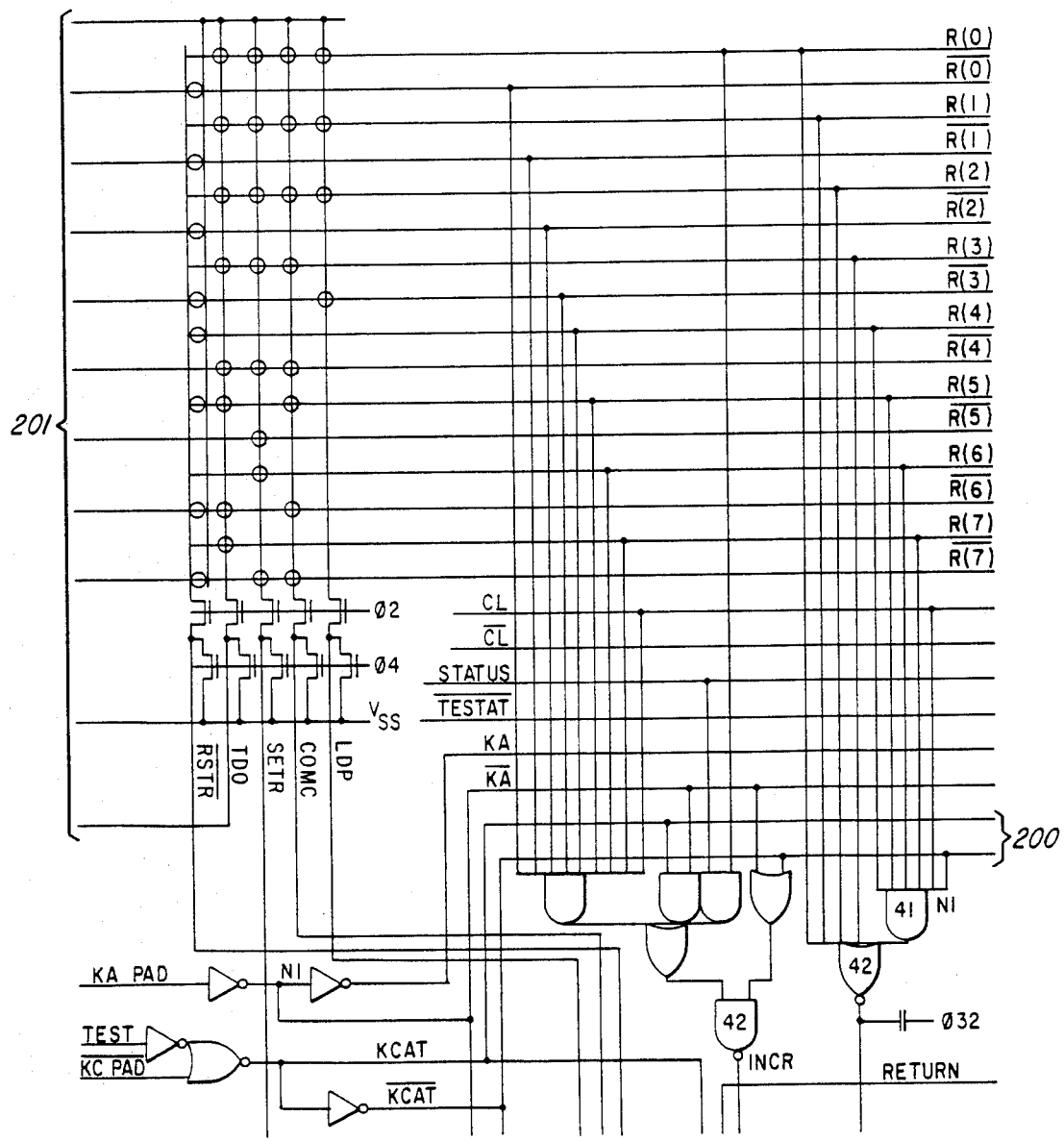
Figure 6D:
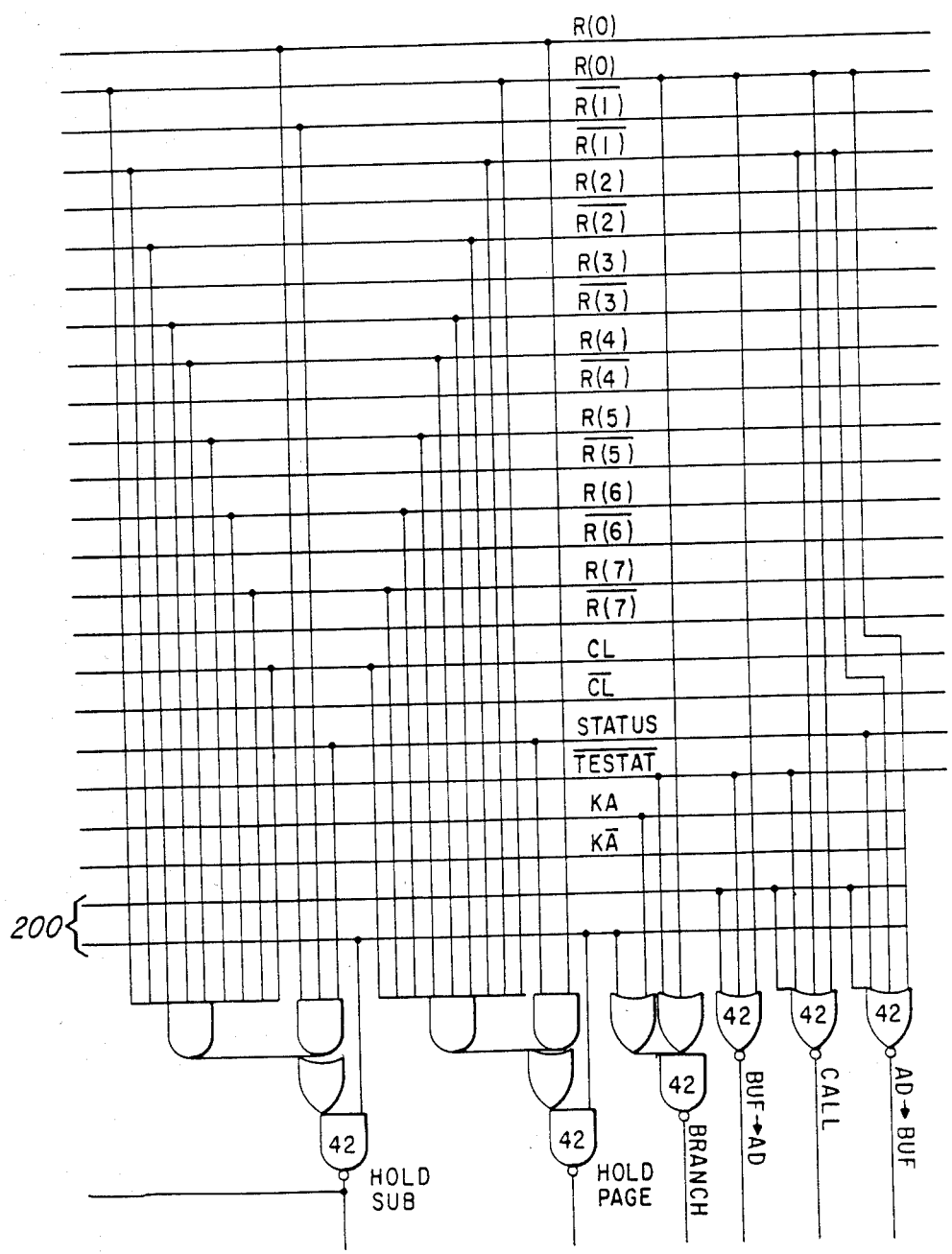

FIG. 5 illustrates the block diagram of the microcomputer circuitry disclosed. It should be noted that this microcomputer circuitry is similiar to that disclosed in U.S. Pat. No. 3,991,305 which is herein incorporated by reference. In addition, this basic type of architecture is also disclosed in U.S. Pat. application Ser. No. 216,113 which is also herein incorporated by reference. Instructions for this microprocessor system are contained in the read only memory (ROM) which are addressed by a chapter register (CA,), page register (PAGE), and program counter (PC). The chapter register and page register both contain a chapter buffer (CB) and page buffer (PB). In addition, there is provided a three level stack for subroutine calls. The output of the ROM is decoded by an instruction decoder to provide the control signals for the remainder of the microcomputer circuitry. The timing for the microcomputer circuitry is provided by the oscillator. The input to the device is through the K1 through K4 ports. These inputs are applied to the four bit arithmetic logic unit (ALU). The ALU also receives inputs from a random access memory RAM (a device provided for temporary storage of data). The arithmetic logic unit outputs to a Y register and an accumulator which also may provide inputs back into the arithmetic logic unit. The Y register also outputs to the RAM and to register digit outputs from the microcomputer (R0 through R12). The accumulator provides output to the output programmed logic array (OPLA) which in turn provides data to the display RAM. The display RAM also receives an output from the Y register. The common line generator, display RAM and segment drivers provide outputs to drive LCD devices.

This block diagram (without the LCD interface) is discussed in more detail in the *TMS 1000 Series Data Manual*, dated December 1975, published by Texas Instruments Incorporated, which is herein incorporated by reference. This circuitry is also discussed in the *TMS 1000 Series MOS/LSI One Chip Microcomputers Programmers Reference Manual*, published by Texas Instruments Incorporated and herein incorporated by reference.

FIGS. 6a through 6d illustrate the instruction decode block shown in FIG. 5. This circuitry provides the control signals from the microinstructions stored in the ROM.

Figure 7:
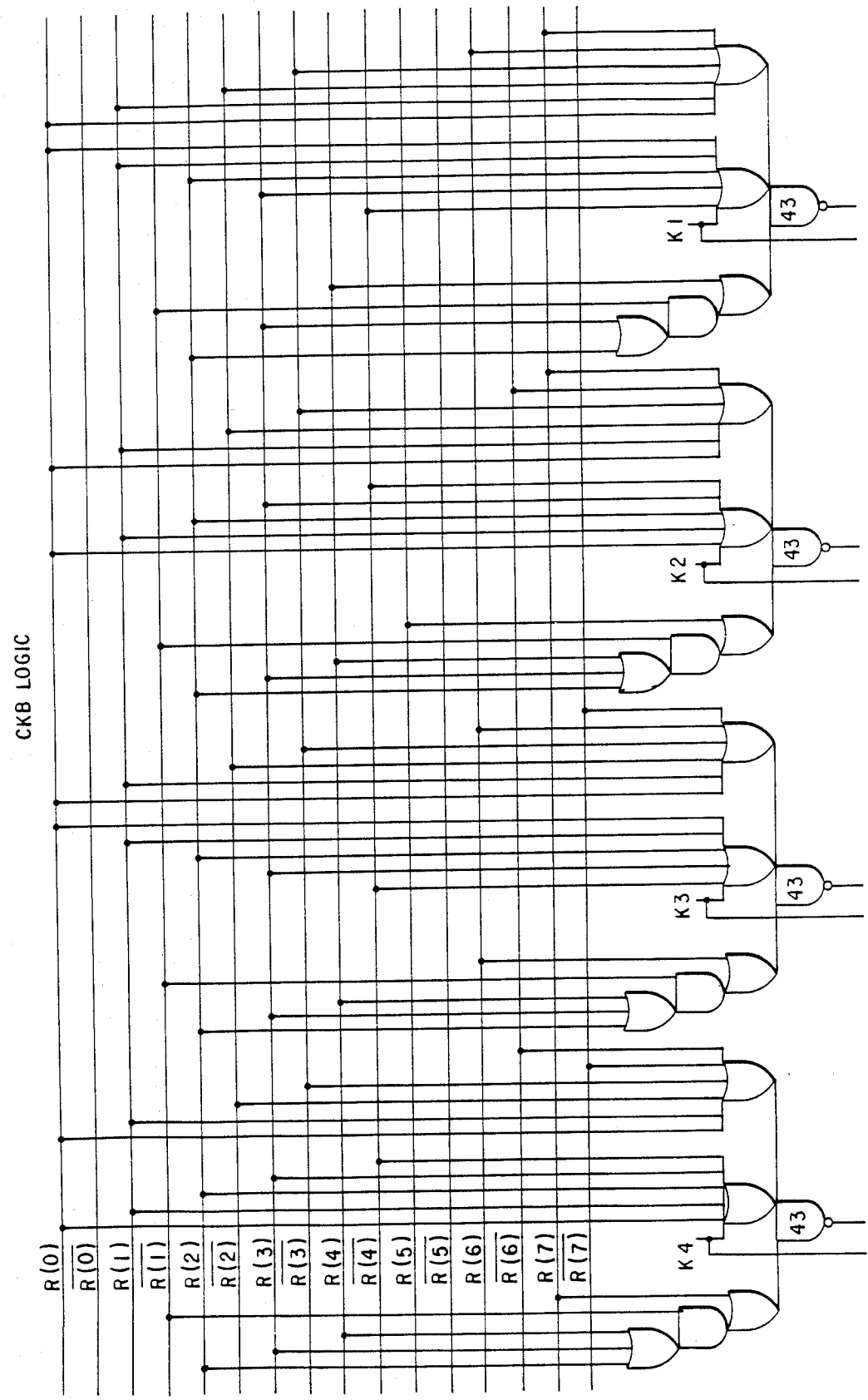
FIG. 7 is a schematic diagram of the constant and keyboard logic.

FIG. 7 illustrates the constant and keyboard bit logic. The overall function of this logic is three-fold. First, a constant appearing in the field of an instruction code may be outputted. Second, the keyboard or external inputs may be outputted. Third, one of the four output lines may be selected for addressing one of the four bits of the digits stored in the RAM. All of these functions are under the control the instructions from the ROM.

Figure 8A:
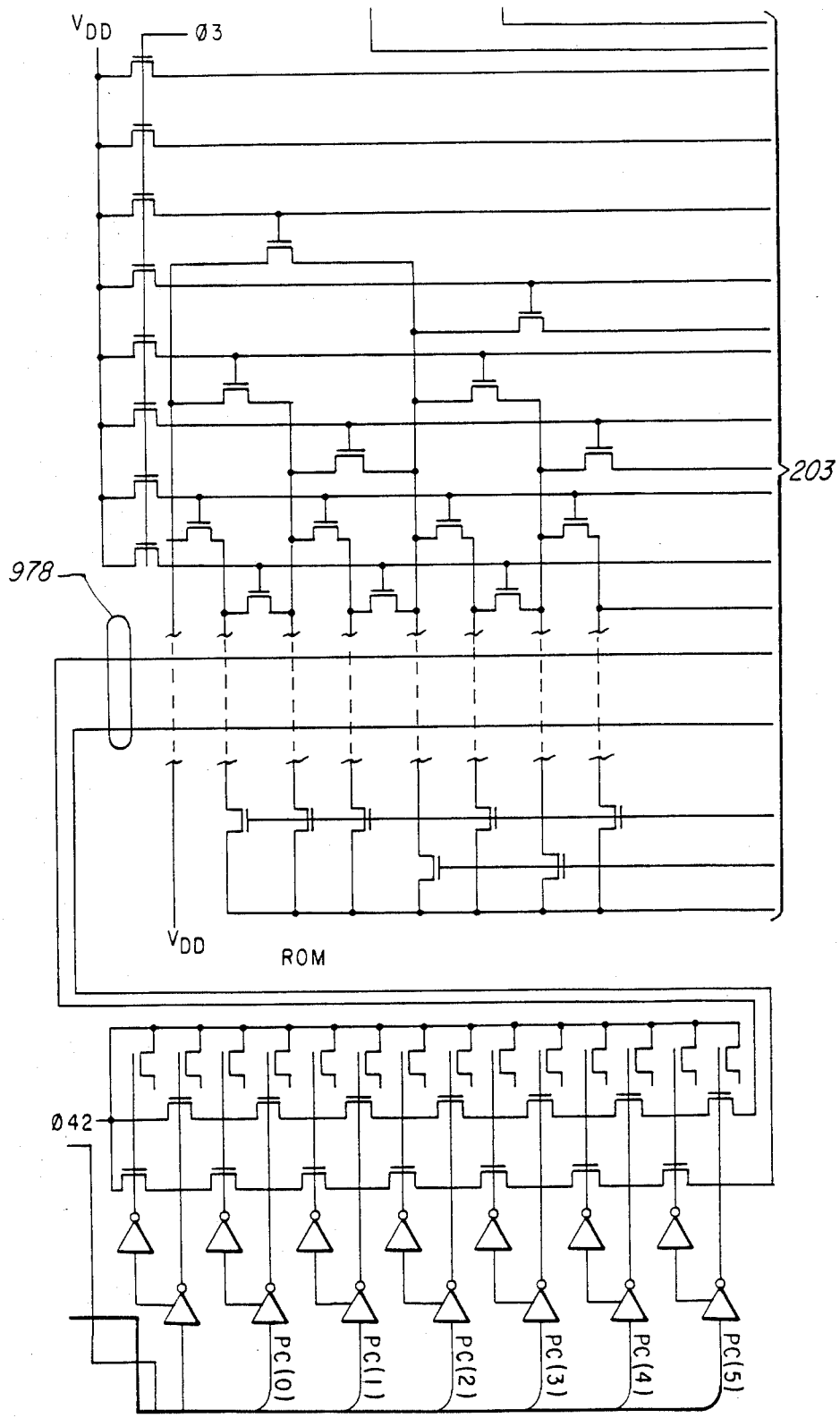
FIG. 8 is a schematic diagram of a read only memory.
Figure 8B:
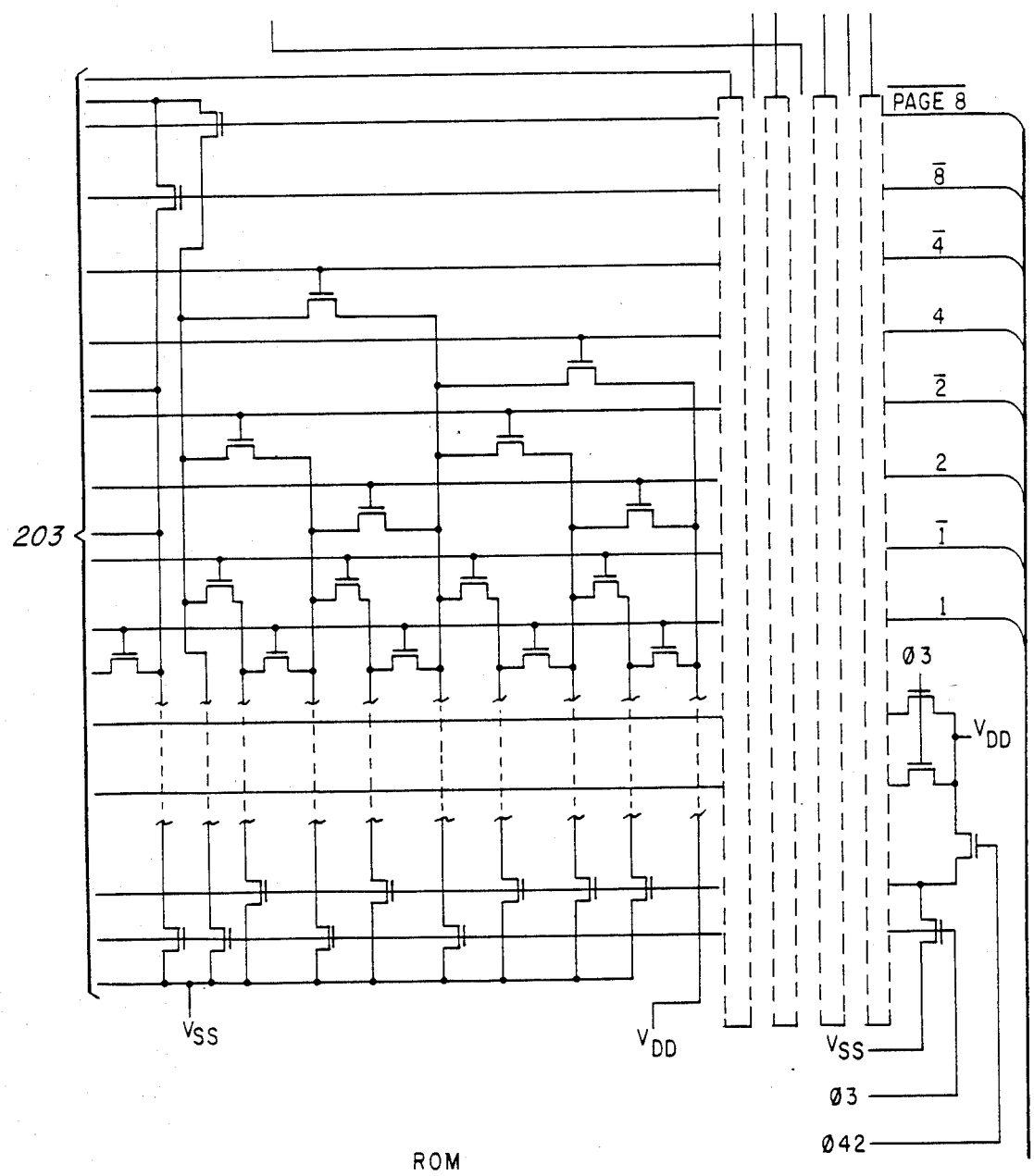
Figure 9B:
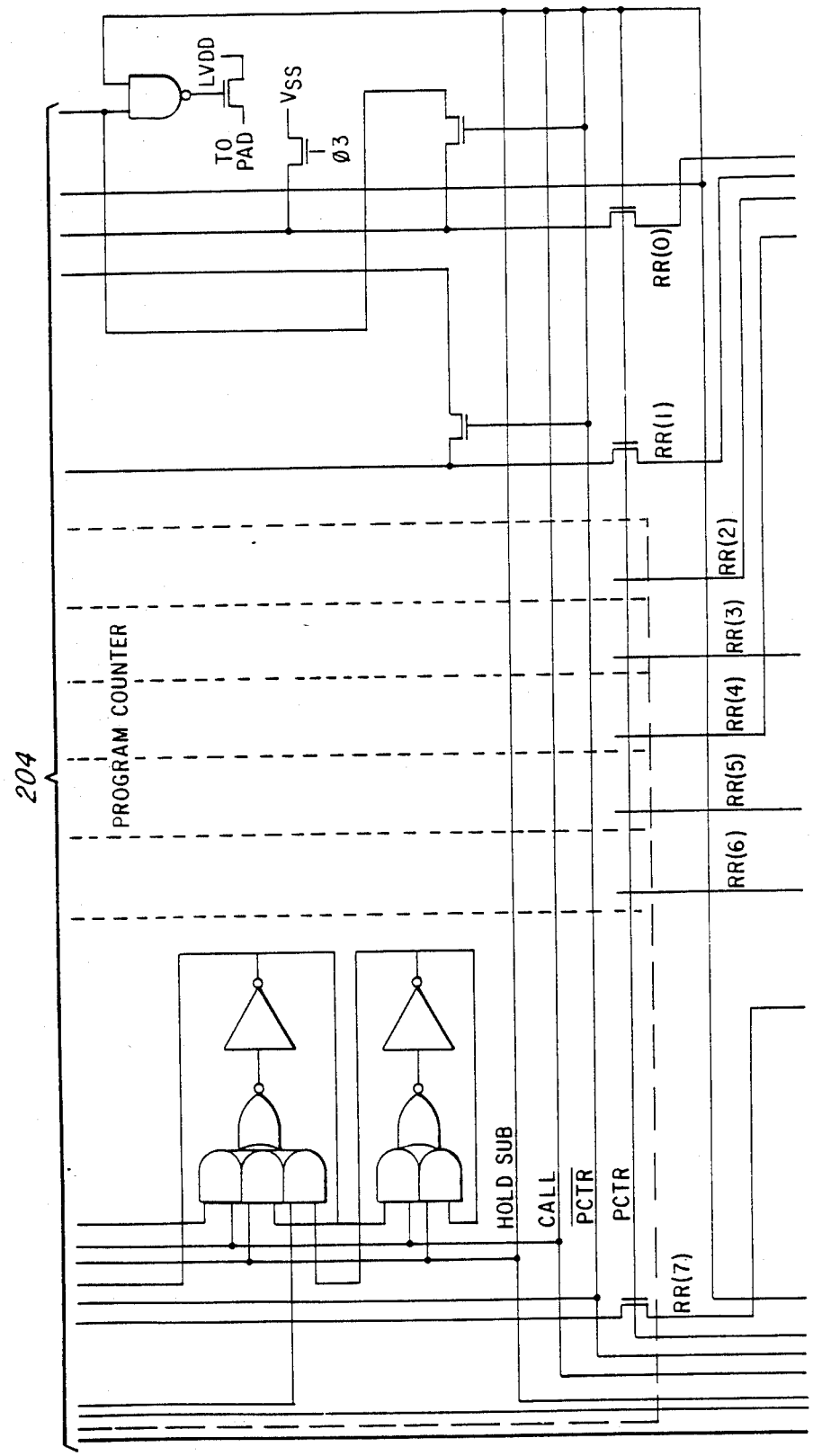
FIG. 9 is a schematic diagram of the program counter.
Figure 10A:
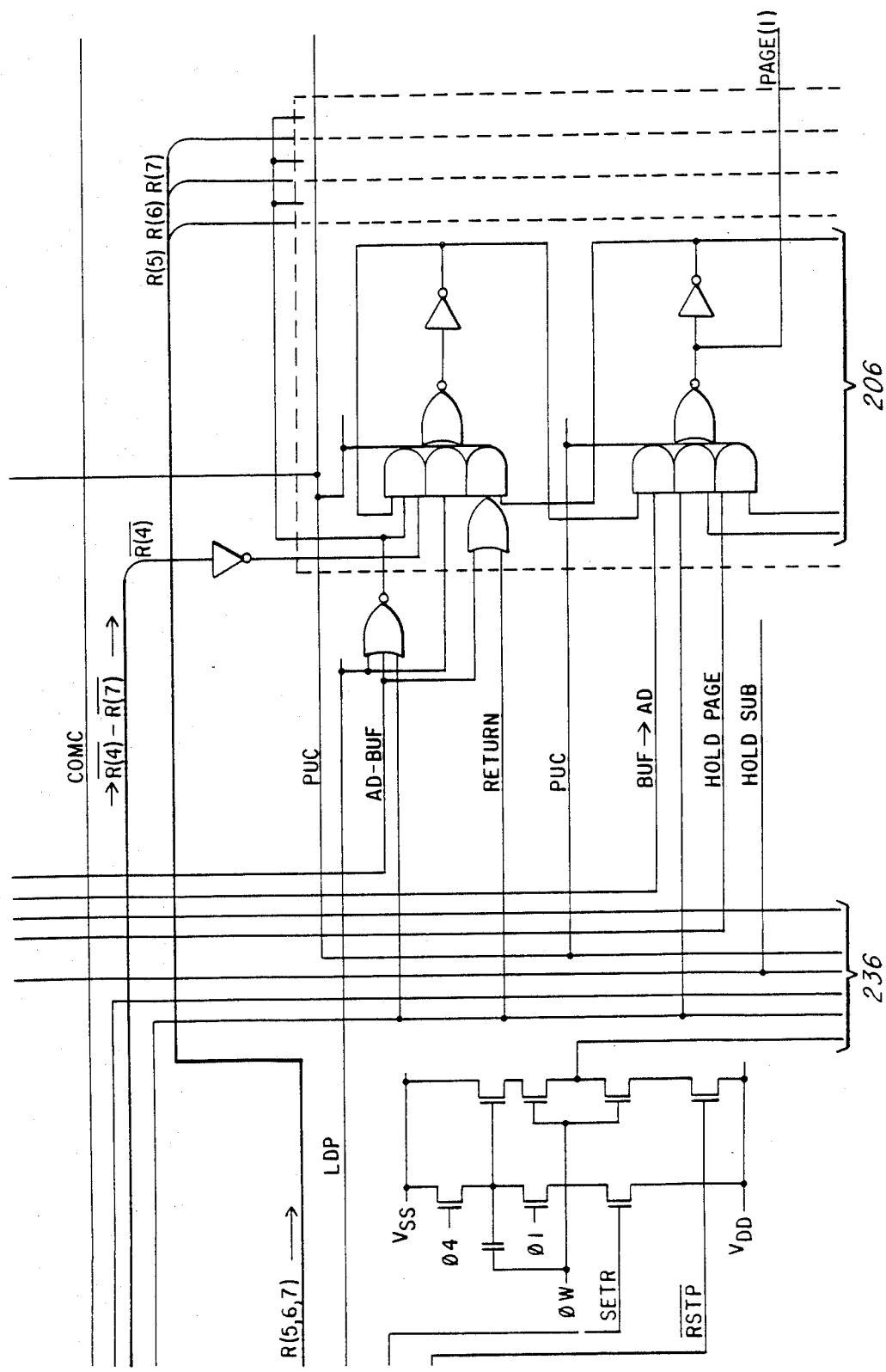
FIG. 10 is a schematic diagram of the chapter register and page register.
Figure 10B:
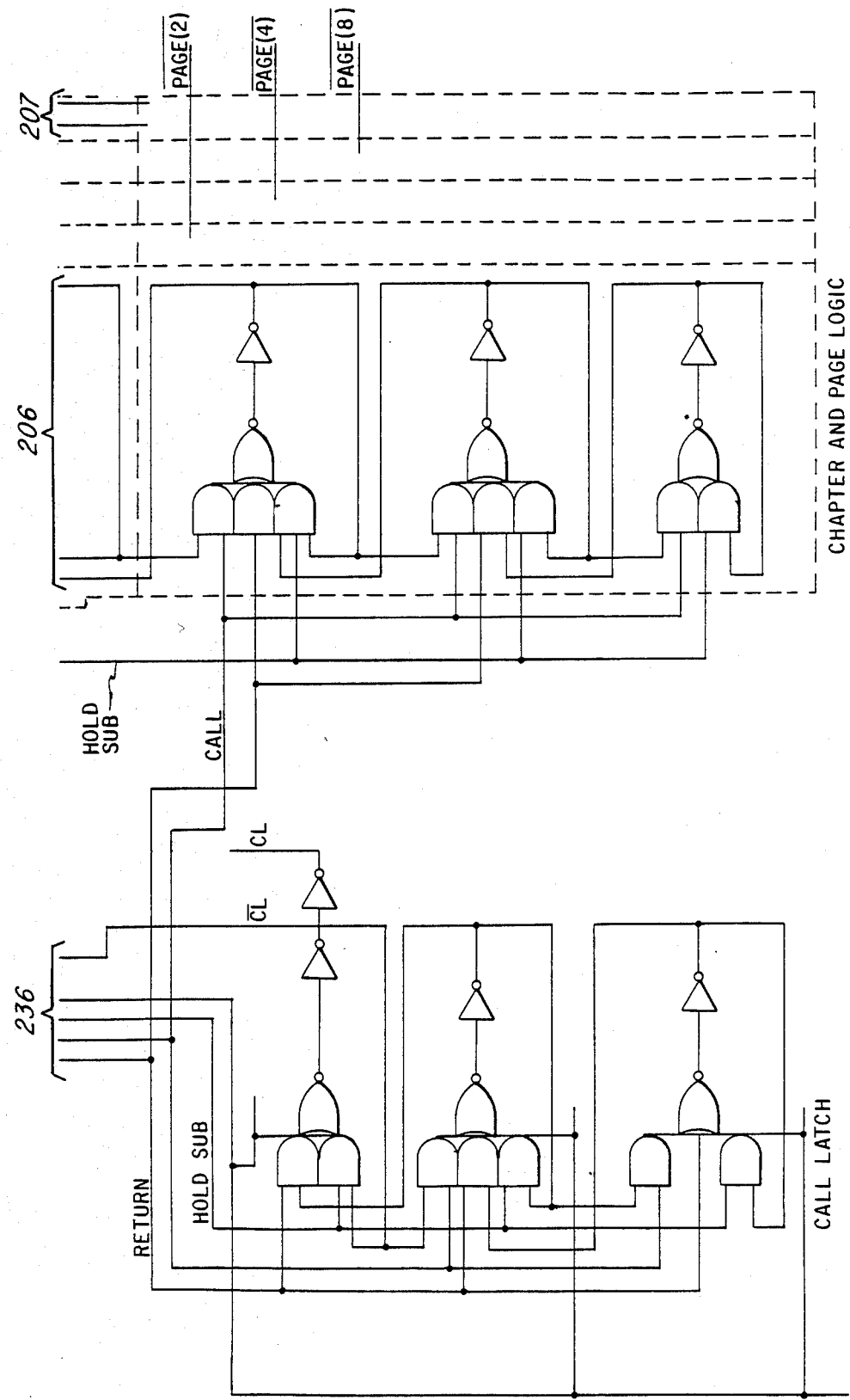
Figure 10C:
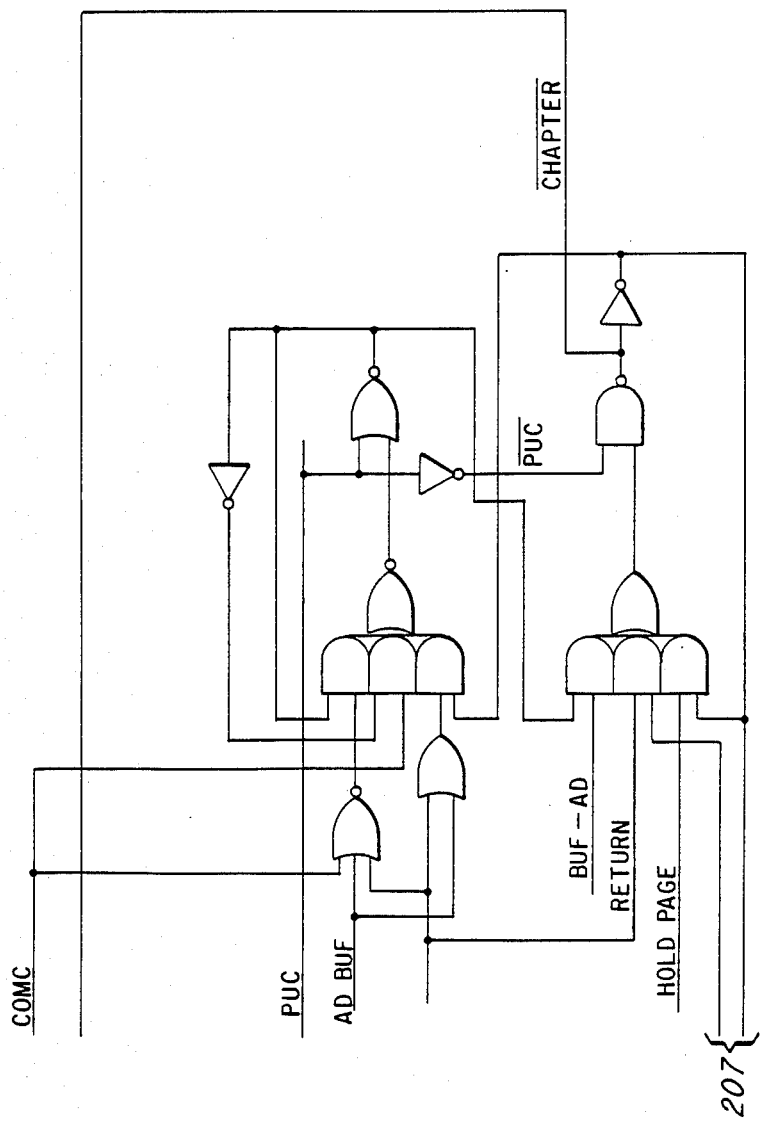
Figure 10D:
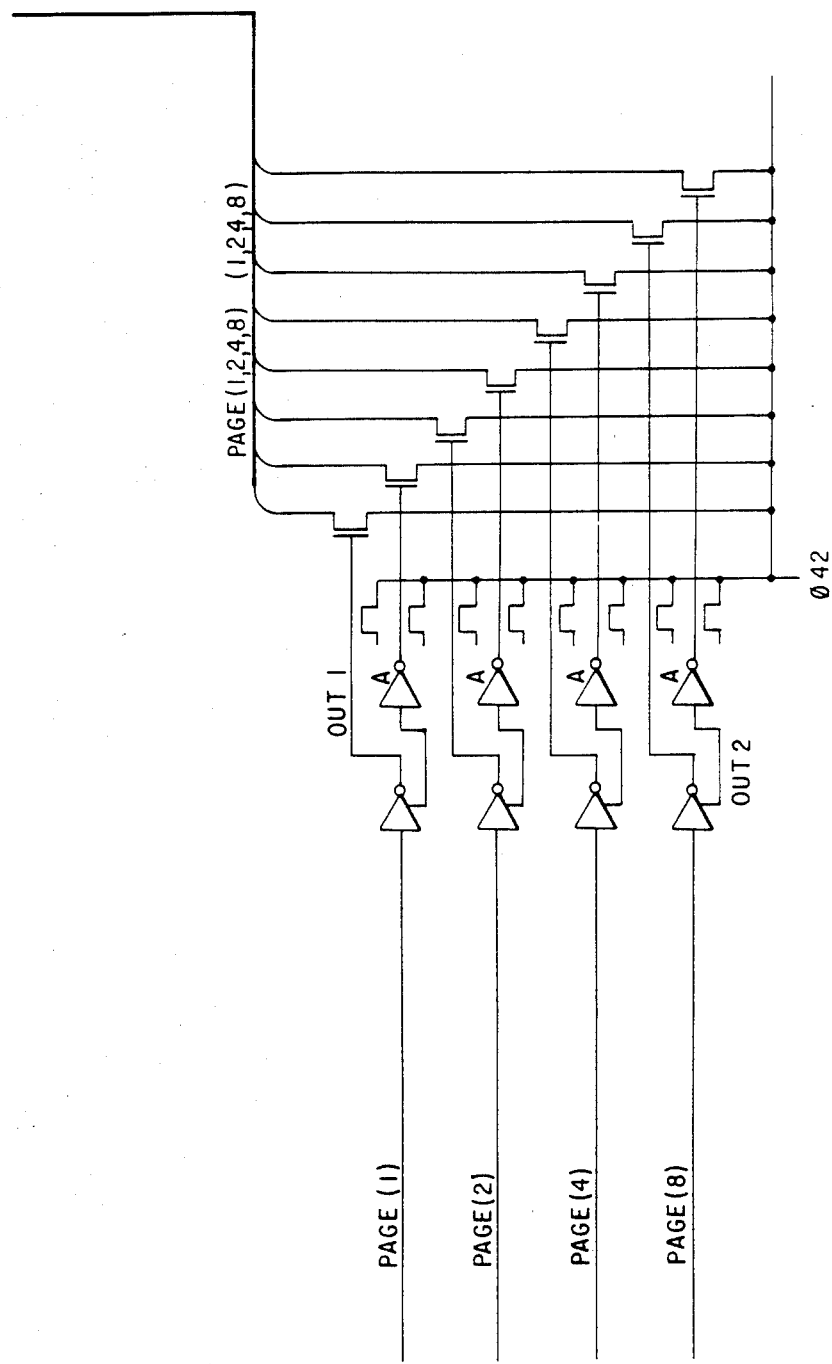

FIG. 8 illustrates the read only memory (ROM). It should be noted that lines 978 are only one of 128 lines not shown. The ROM stores the instructions which specify the operations of the logic. In this architecture the ROM contains 2,048 eight bit instruction words. The ROM is organized as two chapters of 16 pages each. Each page contains 64 instruction words. The ROM is addressed by a one bit chapter address and 4 bit page address contained in the registers shown in logic of FIG. 10. In addition, the ROM is addressed by a 6 bit program counter (PC) as shown in FIG. 9. Each of the above has a three level subroutine stack for algorithm design. The program counter sequences in a pseudo random sequence (0, 1, 3, 7, F, . . . 10, 20, 0, 1, etc.) which is 64 states long. This sequencing continues unless changed by the execution of a BRANCH, CALL or RETURN instruction. In the preferred embodiment, the instruction at chapter 0, page F, program counter 00 is executed first upon the powerup.

Figure 11A:
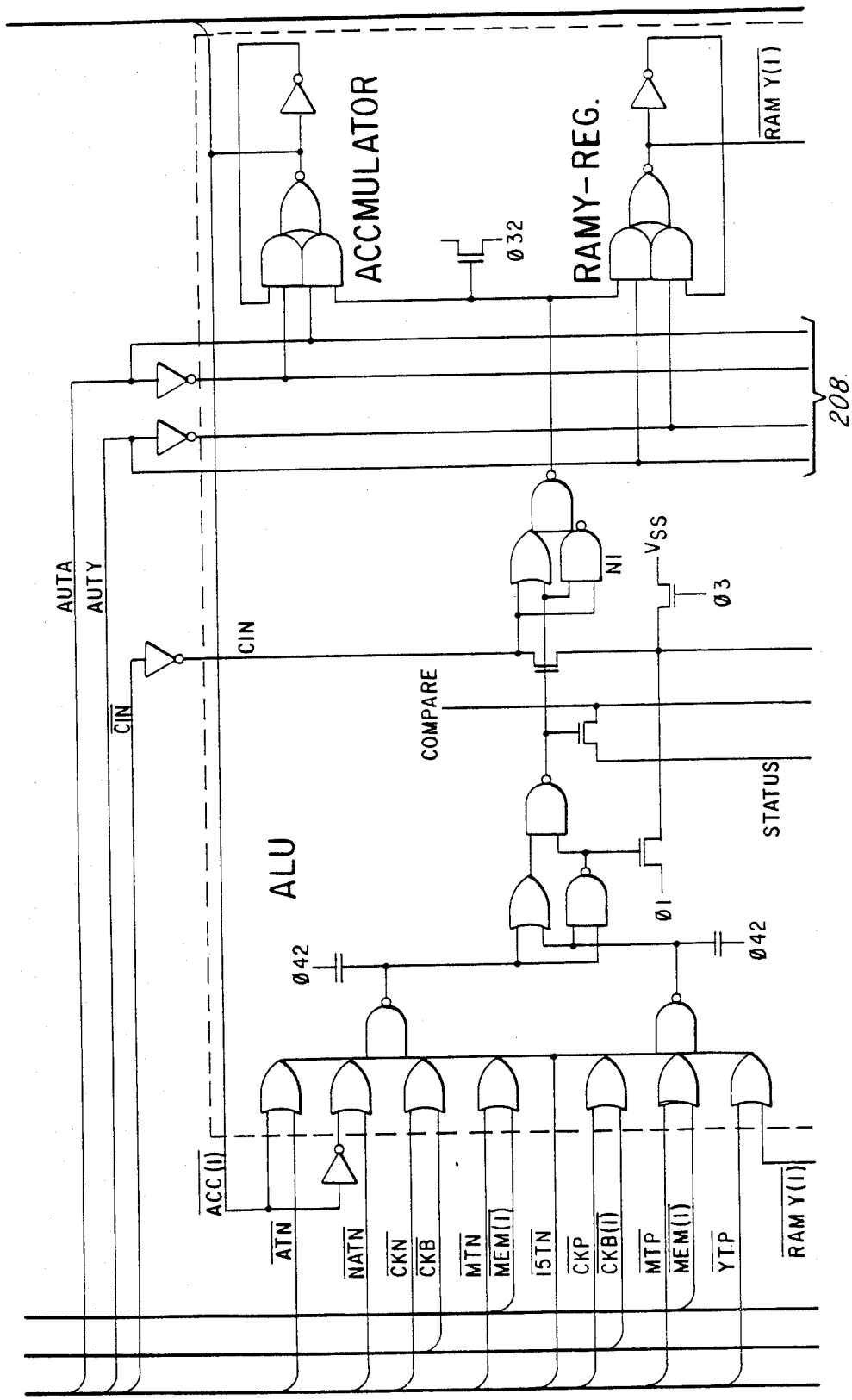
FIG. 11 is a schematic diagram of the arithmetic logic unit, Y register and accumulator.
Figure 11B:
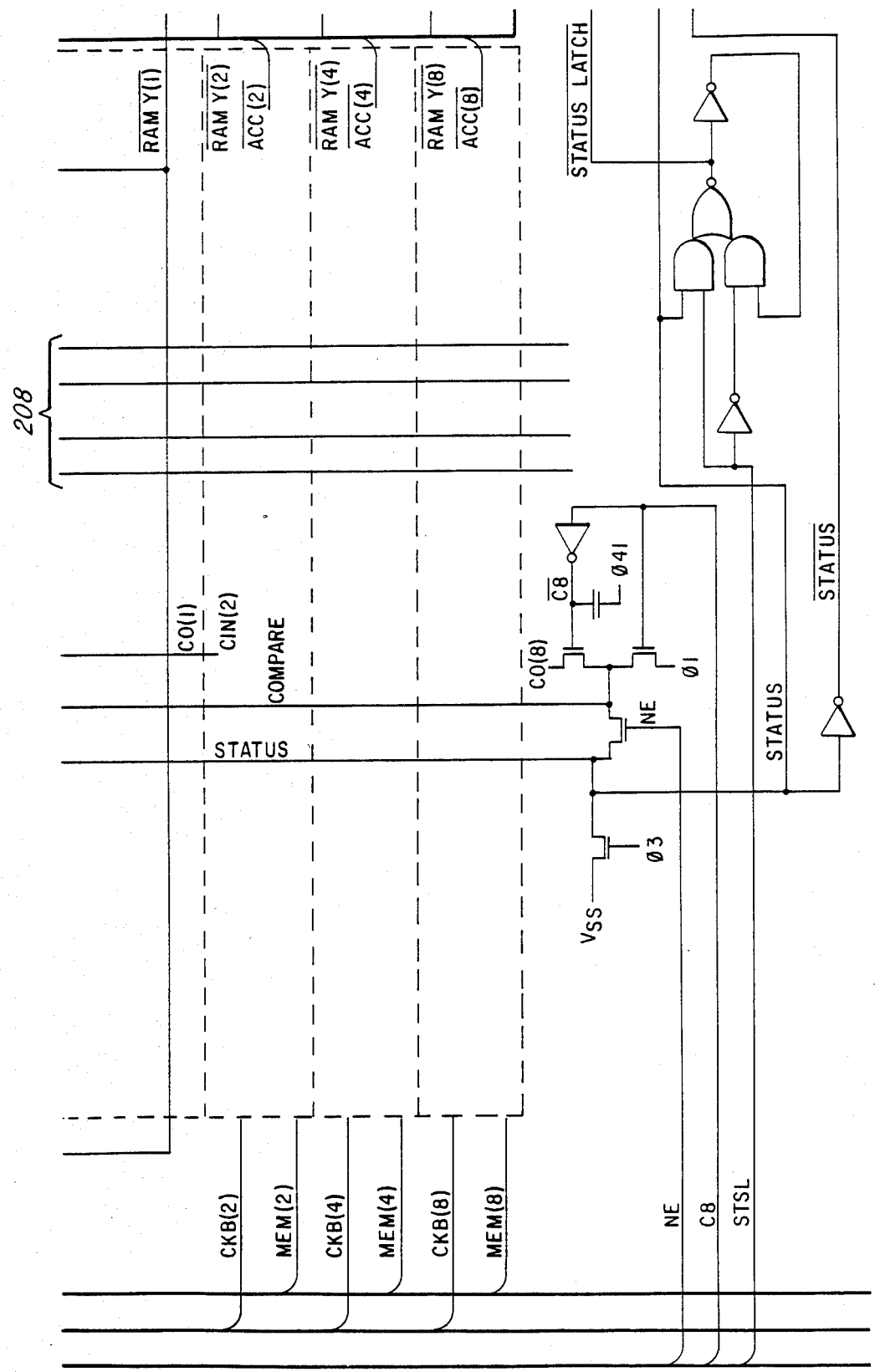

Arithmetic and logic operations are performed by the 4 bit arithmetic unit associated logic shown in FIG. 11. The arithmetic logic unit performs logic comparison, arithmetic comparison and add functions. The operations are performed on two sets of inputs. The two four bit parallel inputs may be added together or logically compared. The accumulator has an inverted output to one of the ALU inputs for subtraction by two complement arithmetic. This input can also be the true output of the accumulator, the RAM, an instruction constant or the keyboard input. The other input comes from the Y register, the RAM, an instruction constant or the keyboard input. The constants are provided by the instruction words stored in the ROM. Addition and subtraction results are stored in either the Y register or the accumulator. An arithmetic function may cause a carry output to the status logic. Logic comparison may generate an output to the status logic. If comparison functions are used, only the status bit affects the program control and neither the Y register contents or the accumulator register contents are affected. If the status bit is the logical 1 which is the normal state, then the BRANCH or CALL instruction is executed successfully. If the instruction resets the status bit (not carry or compare or bits equal), the status will go to a 0 state for one instruction cycle and then return to the 1 state. If the status bit is 0, then the BRANCH or CALL is not taken and the next instruction is executed at PC+1 (the next normal program counter sequential address).

Figure 12:
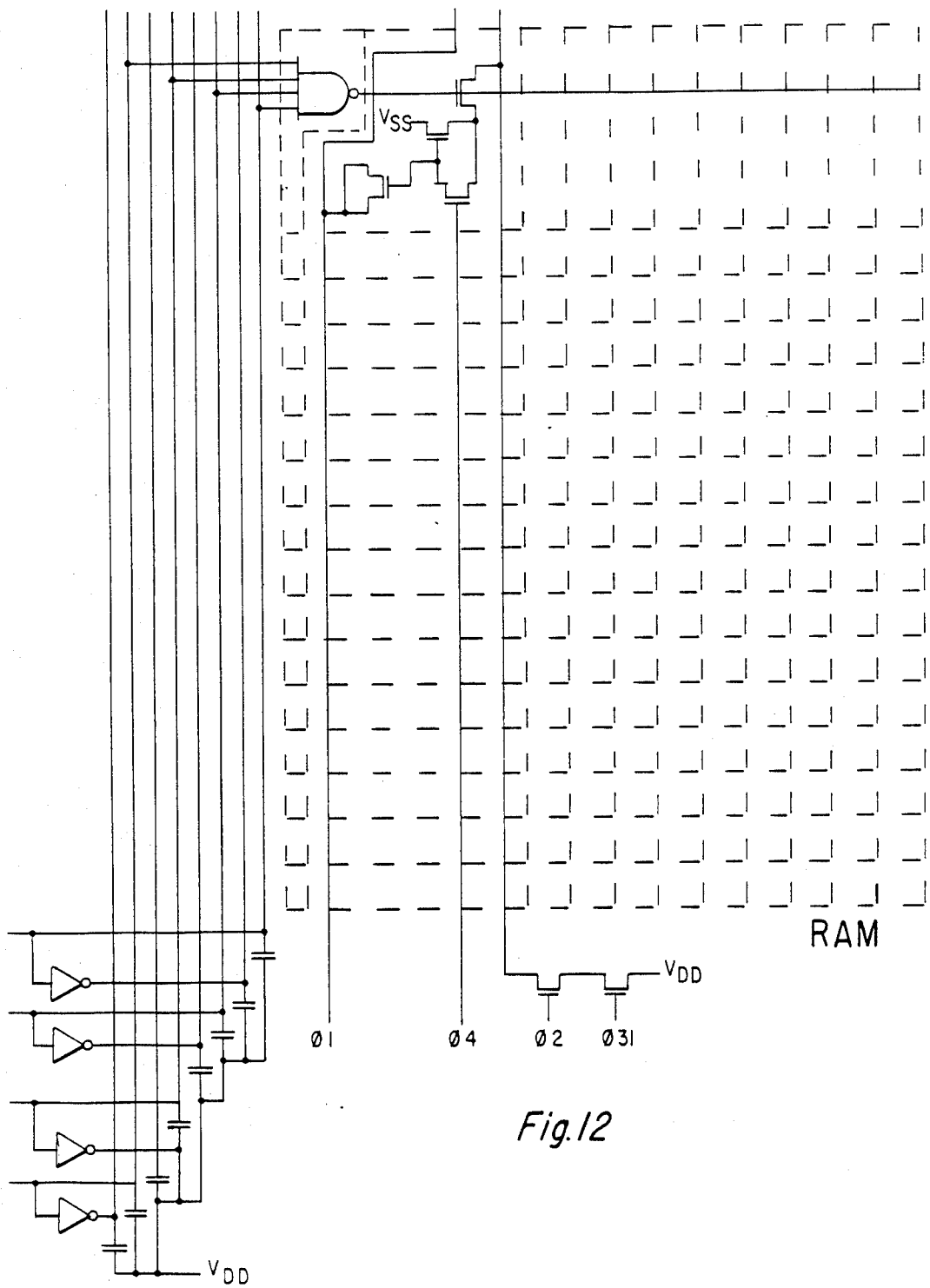
FIG. 12 is a schematic diagram of the random access memory.
Figure 13:
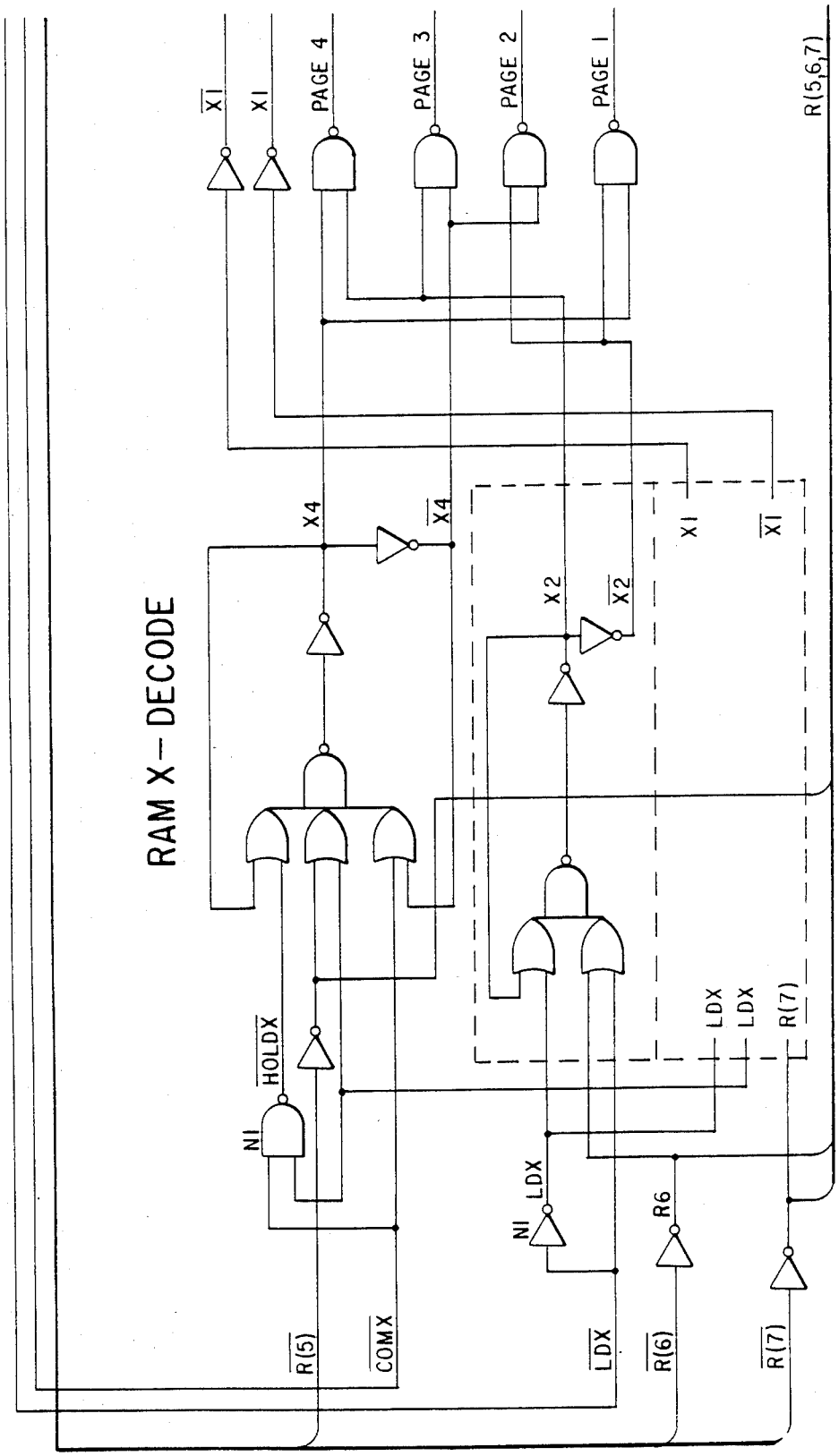
FIG. 13 is a schematic diagram of the X decode circuitry for addressing the random access memory.
Figure 14A:
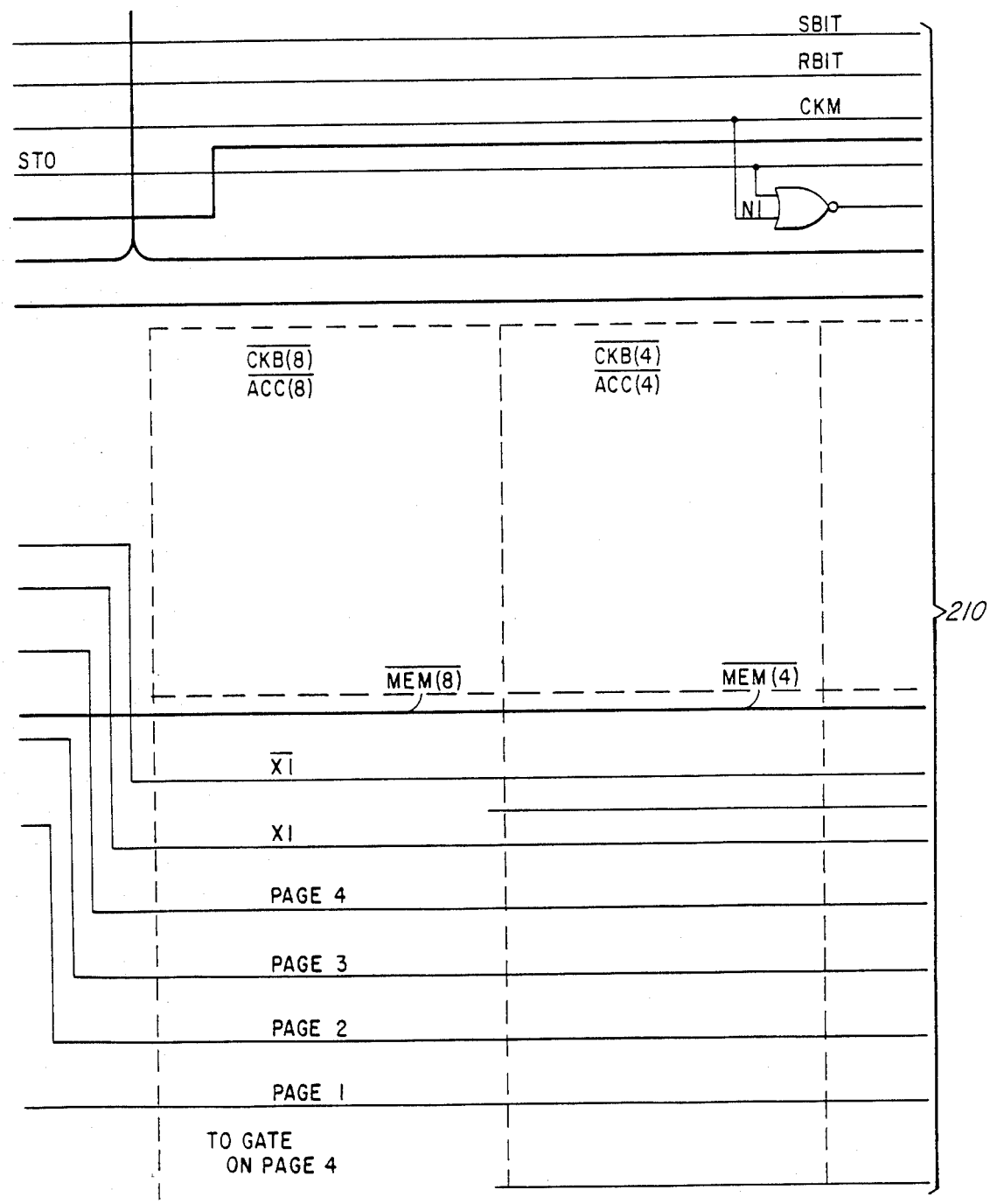
FIG. 14 is a schematic diagram of the X register address circuitry and WRITE logic.
Figure 14B:
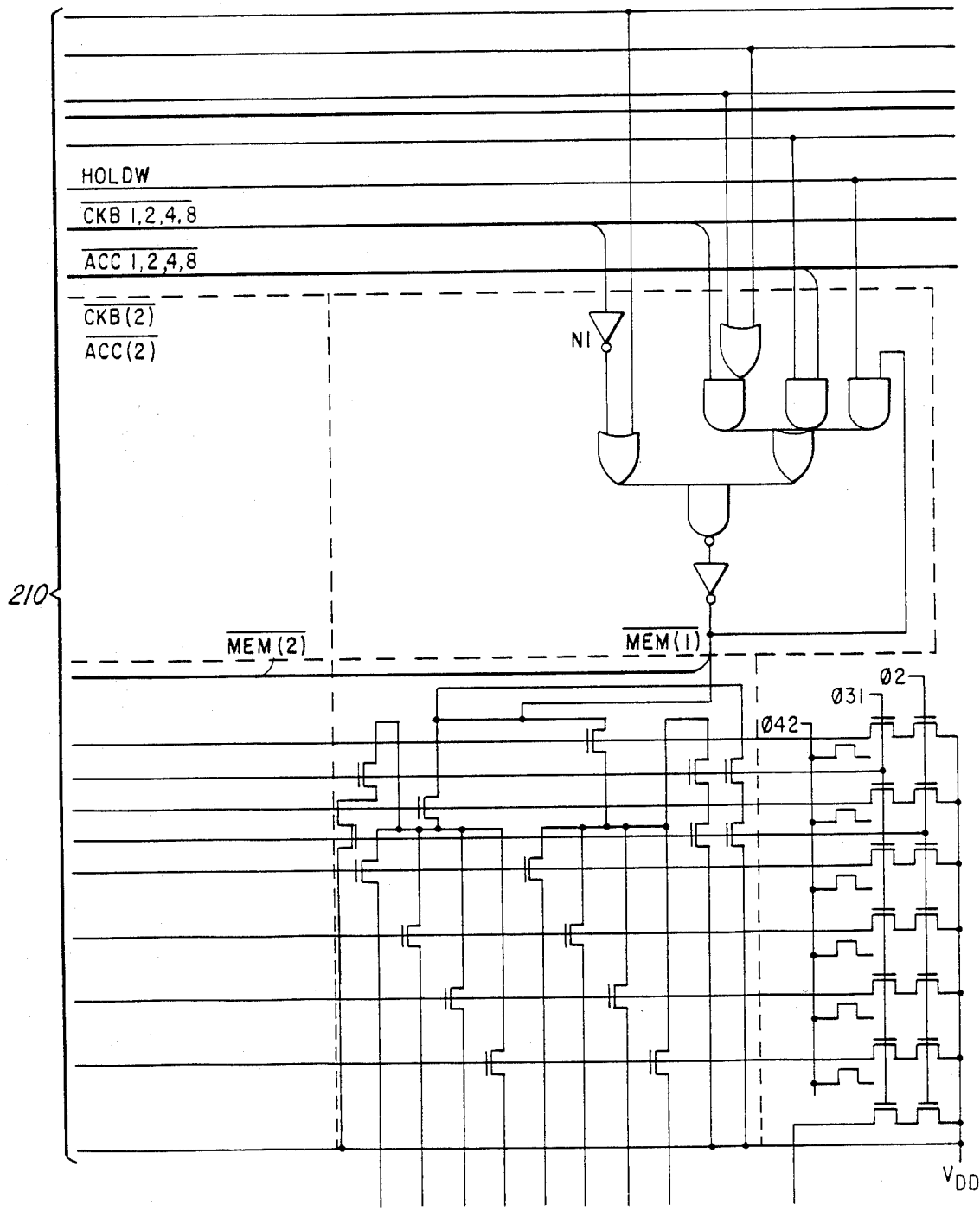

The random access memory (RAM) is illustrated in FIG. 12. The RAM provides temporary storage of data from the arithmetic logic unit through the Y register. The RAM is addressed by the Y register and the instructions through the X register. The X register decoding circuitry is shown in FIG. 13. This circuitry is connected to the X address circuitry as shown in FIG. 14.

Figure 15:
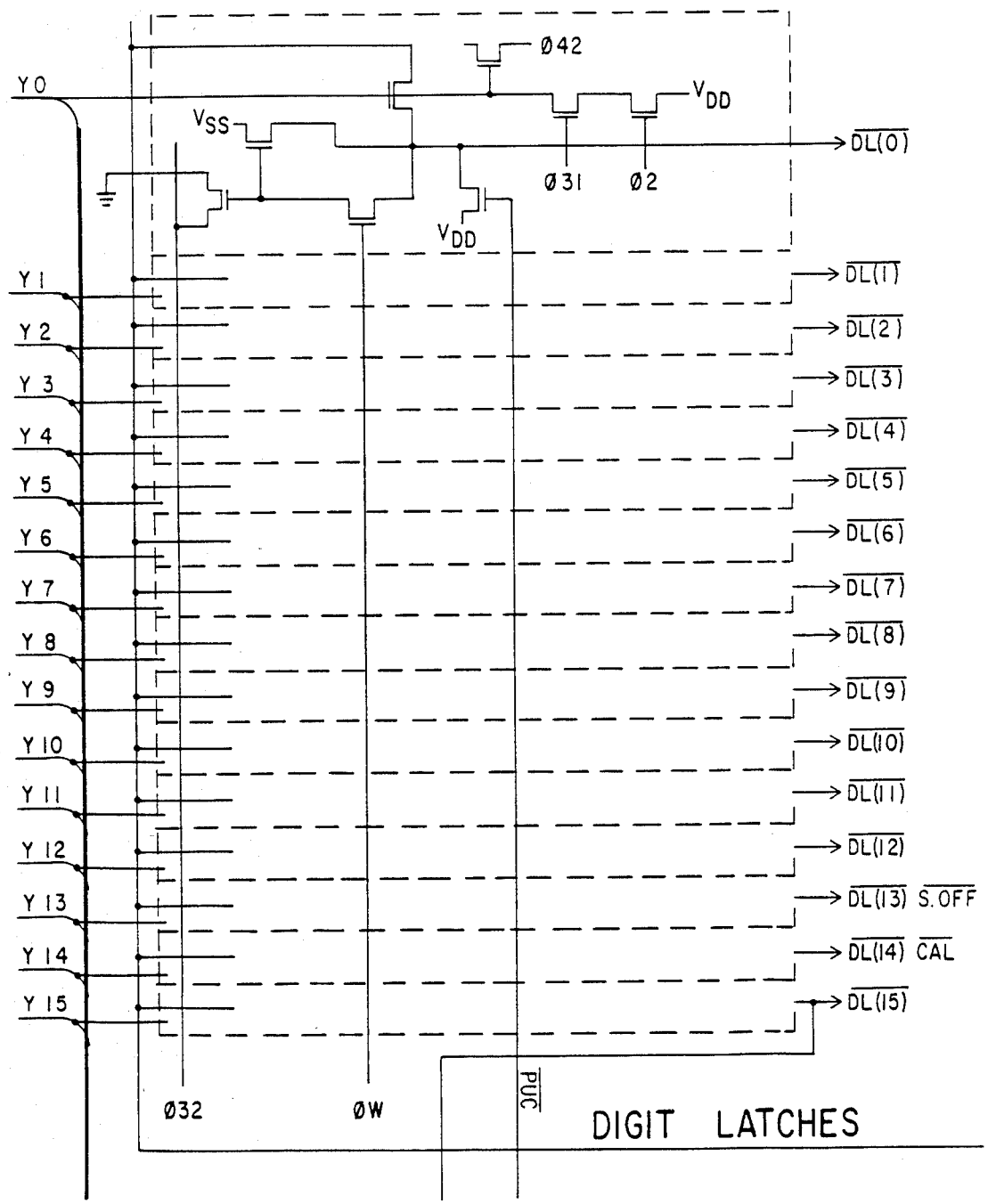
FIG. 15 is a schematic diagram of the digit latch circuitry.

The Y register may additionally address 13 output latches described as digit latches as shown in FIG. 15. Note that FIG. 15 actually illustrates 16 latch outputs. However, the three most significant bit latches DL 13, DL 14, DL 15, are deducated to special functions and not available for external output.

Figure 16:
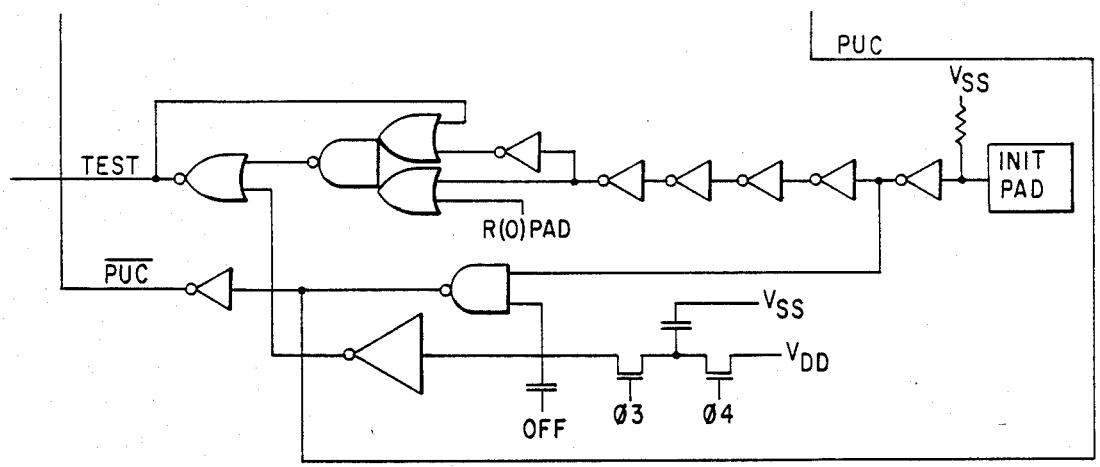
FIG. 16 is a diagram of the initialization circuitry and test latch.
Figure 17:
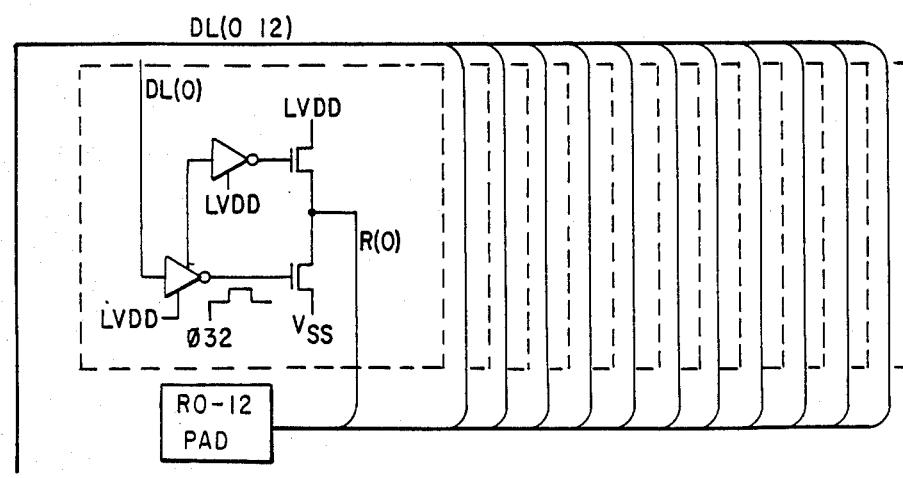
FIG. 17 is a schematic diagram of the register output circuitry.

The initialization circuitry is illustrated in FIG. 16. This circuitry provides the initialization signal for the microcomputer in addition to providing a test indication when the initialization pad receives its input in conjunction with an input on the RO pad. Therefore, the digit latch RO serves both an input and output function. The actual register output circuitry is shown in FIG. 17. This circuitry receives its inputs from the digital latches in FIG. 15. Each output may be individually set or reset by addressing the output with the Y register then executing an SETR or RSTR instruction. Each output may be mask programmed to be one of three options: push pull, open drain pull high, or open drain pull low to best fit the user's application. A SETR instruction will turn on the pull high device if present. Sourcing current from Vdd will turn off the pull low device. A RSTR instruction will turn on the pull low device, if present. Sinking current to Vss will turn off the pull high device. The open drain pull low option is for outputs used to scan a keyboard with no external components and avoids input level conflicts for a multikey push inputs. The open drain pull high option is used for maximum current drive capability and to interface to other logic which requires a voltage higher than Vss. The push pull option is used for interface to any CMOS logic running at the same voltage level.

Figure 18:
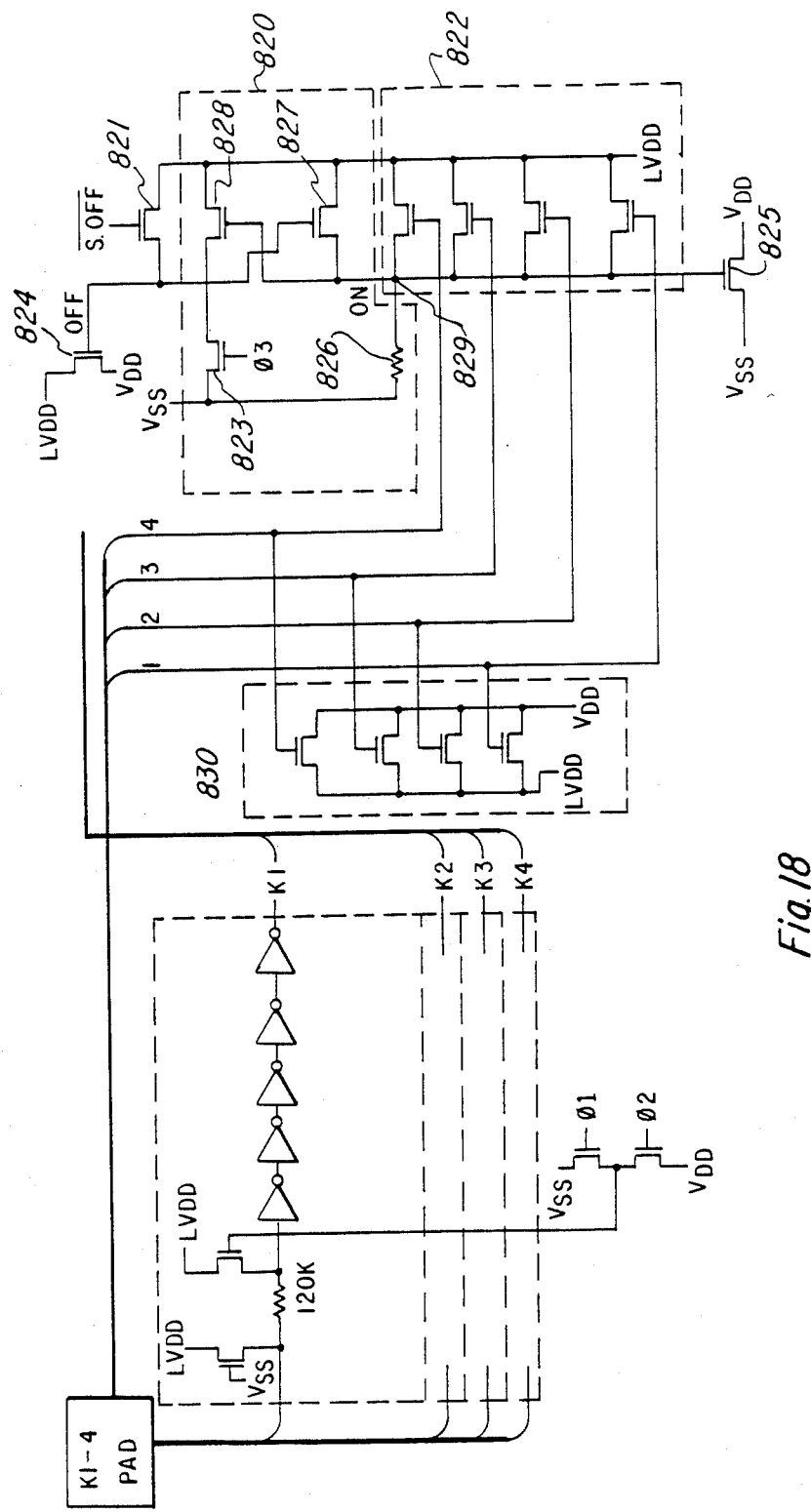
FIG. 18 is a schematic diagram of the keyboard input circuitry and the integrated on/off switch.

The keyboard input circuitry is illustrated in FIG. 18. There are four data inputs, K1, K2, K3 and K4. All inputs are inverted when received to be compatible with the integrated on/off feature. Any input may be tested for a low level with the KNEZ instruction for the 4 bit input or the 4 bit input may be transferred to the accumulator with the TKA instruction through the control keyboard logic as previously discussed. The K inputs are held high internally and are pulled low externally for a "1" level input. The K input for a KNEZ or TKA instruction must be valid for a portion of the prior instruction cycle. The R outputs from the register output circuitry in FIG. 17 (R output pull down option) may be used to scan a matrix of keys with no additional components. If the R lines are used to scan inputs, there must be a minimum of one instruction cycle between the RSTR and the KNEX instruction. In addition to the keyboard inputs, FIG. 18 also illustrates an integrated on/off switch. A central circuit for this on/off switch is the latch 820. In the off state, power is provided from Vss through the resistor 826 to the gate of device 828. However, since the device is off, device 823 will not receive a clocking signal phi 3. Therefore, no power will be present on the line labeled "off" and the circuit will not be dissipating any significant current. An "on" signal is received by any four keyboard hits which will activate any of the four devices 822 or devices 830. Upon activating any of the devices 822, device 828 is turned off because node 827 is pulled Vdd. Devices 830 short Vdd to LVdd and Vdd provides power to the internal clock, thus activating device 823 when phi 3 occurs. When phi 3 occurs, power is provided to the gate of device 827 of the latch 820, thus causing the latch to change states. When this latch changes states, power is provided to gate 824 which continuously provides power from LVdd to Vdd. LVdd is the live Vdd power source which is always on. Vdd provides power to the microcomputer chip.

Figure 19A:
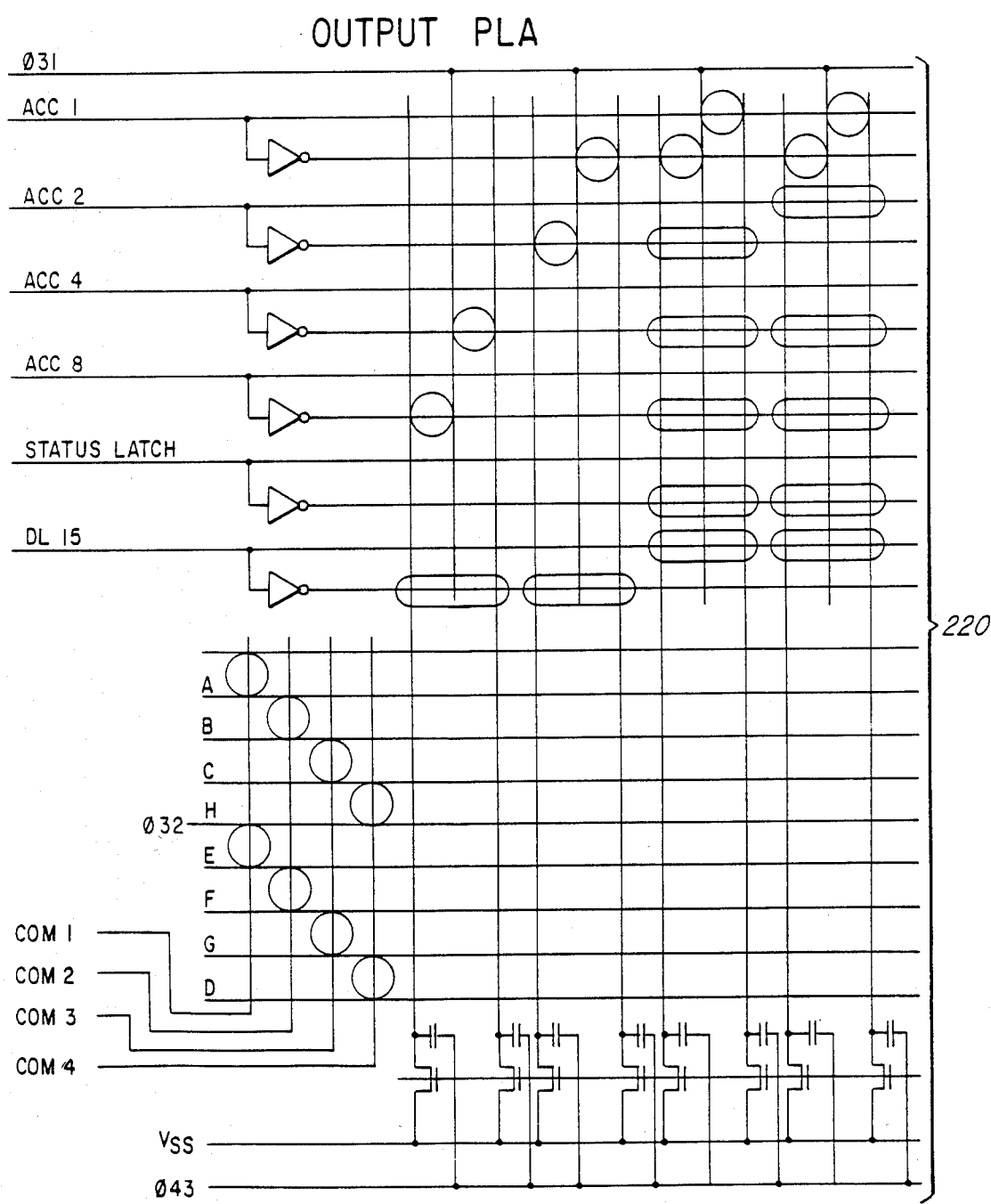
FIG. 19 is a schematic diagram of the output programmed logic array.
Figure 19B:
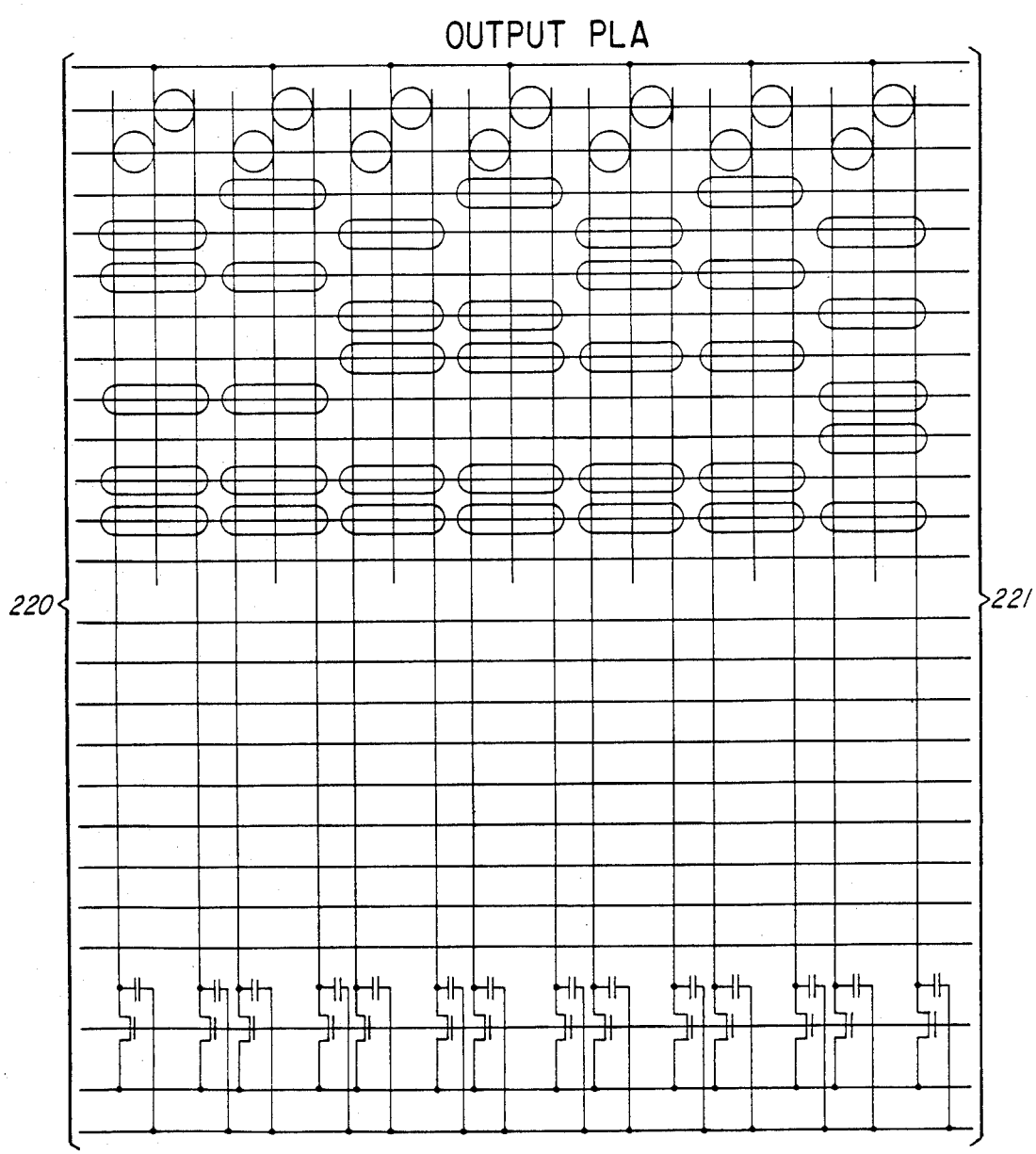
Figure 19C:
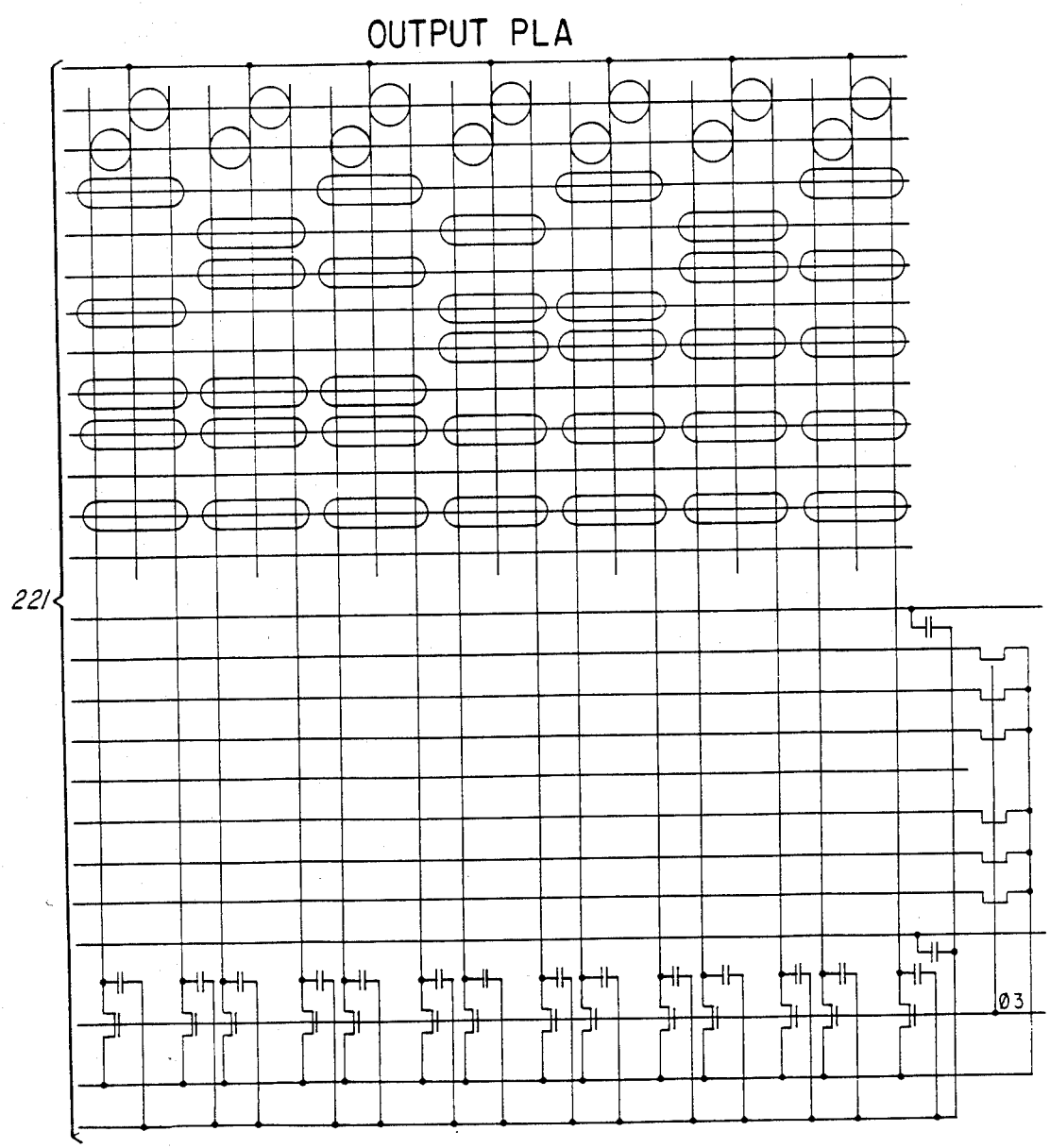
Figure 20:
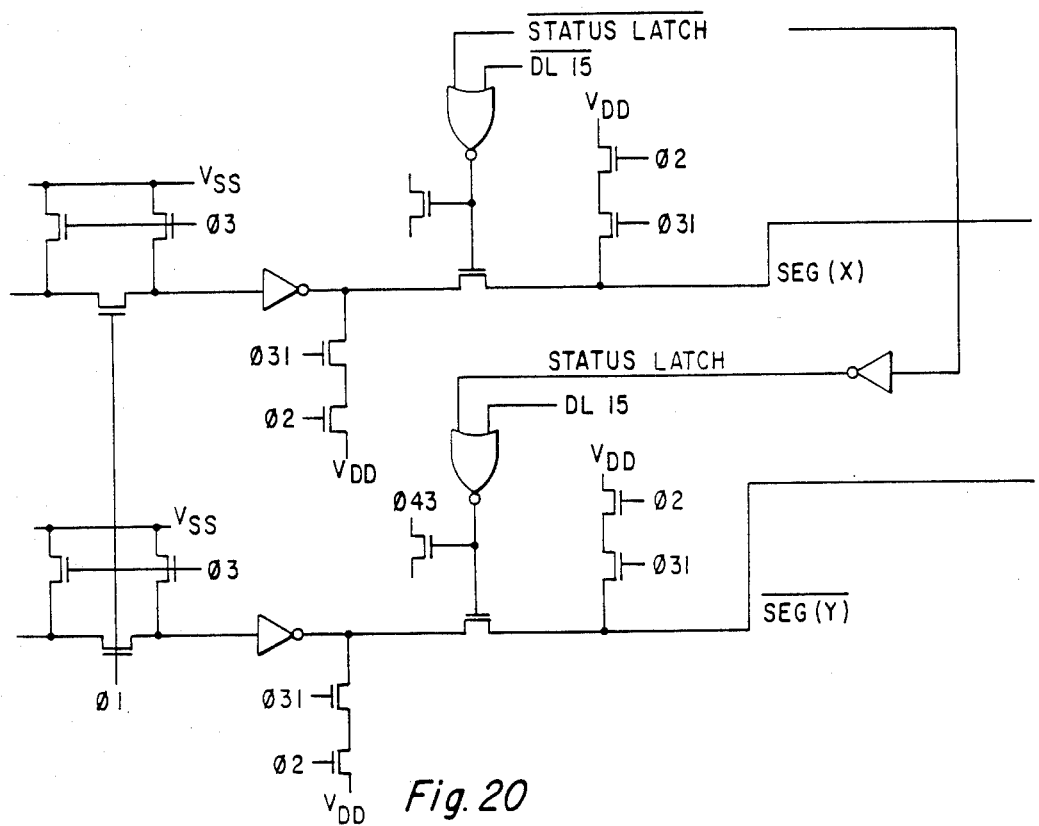
FIG. 20 is a schematic diagram of the segment line circuitry.

FIG. 19 illustrates the output program logic array (OPLA) which decodes the output data from the accumulator for the display RAM. The OPLA output is coupled through the segment line circuitry illustrated in FIG. 20. DL15—, STATUS LATCH and STATUS LATCH— determine whether SEG(X)— or SEG-(Y)— is loaded into the display RAM. These circuitry in FIG. 20 allow for control of the output to the display RAM by digit LATCH 15 which controls the decode or nodecode function of the accumulator lines in FIG. 19.

Figure 21:
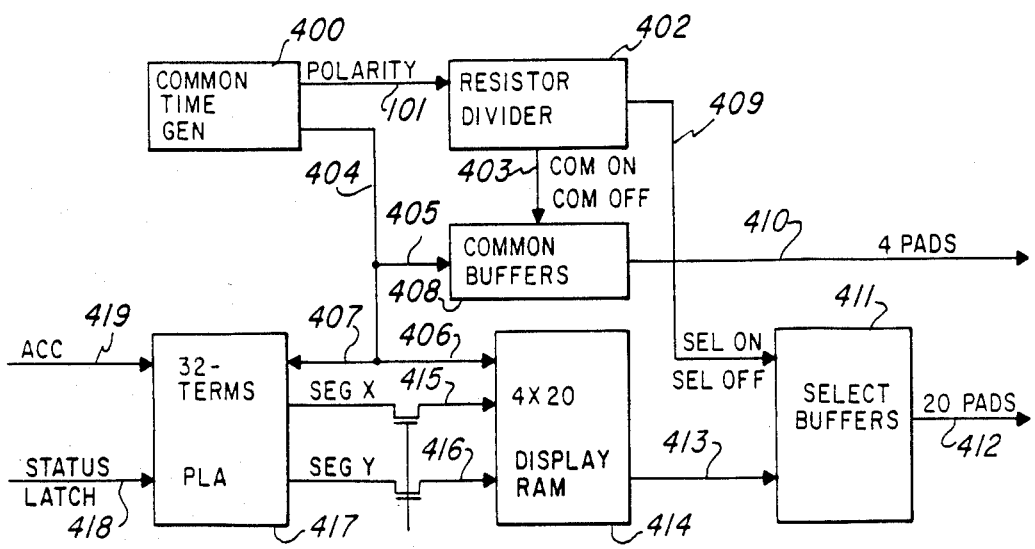
FIG. 21 is a block diagram of the liquid crystal display output circiutry.

FIG. 21 is a block diagram of the liquid crystal display output circuitry. Note that block 414 represents the display RAM and is organized into an array of 20 bits by 4 bits. This diagram also includes the OPLA 417 which receives inputs from the accumulator via lines 419 and the status via lines 418. The OPLA 417 outputs segment X via line 415 and segment Y by lines 416 through the TDO control circuitry to the display RAM 414. The common time generator 400 provides outputs to both the OPLA 417 and display RAM 414 via lines 404, 407 and 406. Outputs to liquid crystal displays consist of two type; common time outputs and select outputs. For a single digit in a liquid crystal display, the outputs of two selects and 4 common times are required. Two selects are dedicated to each digit of a liquid crystal display. However, all four common times are common to all digits of the liquid crystal display. The circuit shown provides outputs to ten digits of a liquid crystal display, i.e., two selects per ten digits for a total of 20 selects. For these 20 selects, the four common times are also provided. For the total display contained in the display RAM 414 an output for each select during each of the four common times is required. The common time generator provides the addressing for the four common times for each of two segments in both the OPLA 417 and the display RAM 414. In addition the common time generator provides the common times to the common buffer 408 via lines 405. The common time generator 400 also provides a polarity signal on line 101 to the resistor divider 402. Liquid crystal displays require signals of an alternating polarity. That is, when a positive signal is received, a negative signal of equal magnitude must be received in sequence to be a proper input. Therefore, all the outputs from the select pads and the common pads must be of one polarity for a certain time and then of the opposite polarity for an equal time to properly interface to a liquid crystal display. This requirement is met by the polarity input to the resistor divider which changes polarity according to the common time generator 400. The resistor divider 402 provides the voltage input to the common buffer 408 which is output to the common pads via line 410. In addition the resistor divider 402 provides voltage to the select line buffers 411 via line 409. The select buffers 411 also receive select data from the display RAM 414 via lines 413. The 20 select lines are output on lines 412.

Figure 22A:
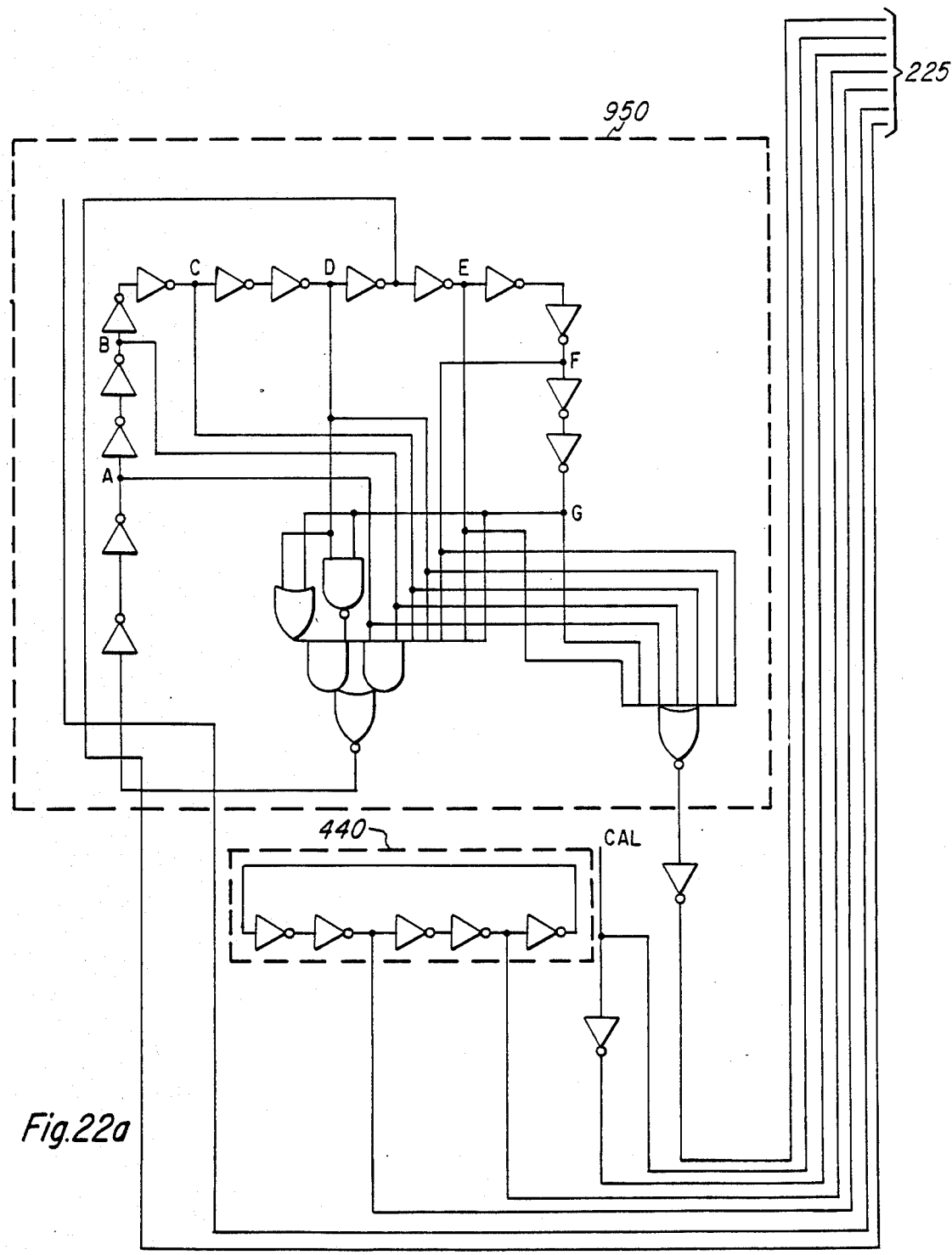
FIG. 22 is a schematic diagram of the common time generator.
Figure 22B:
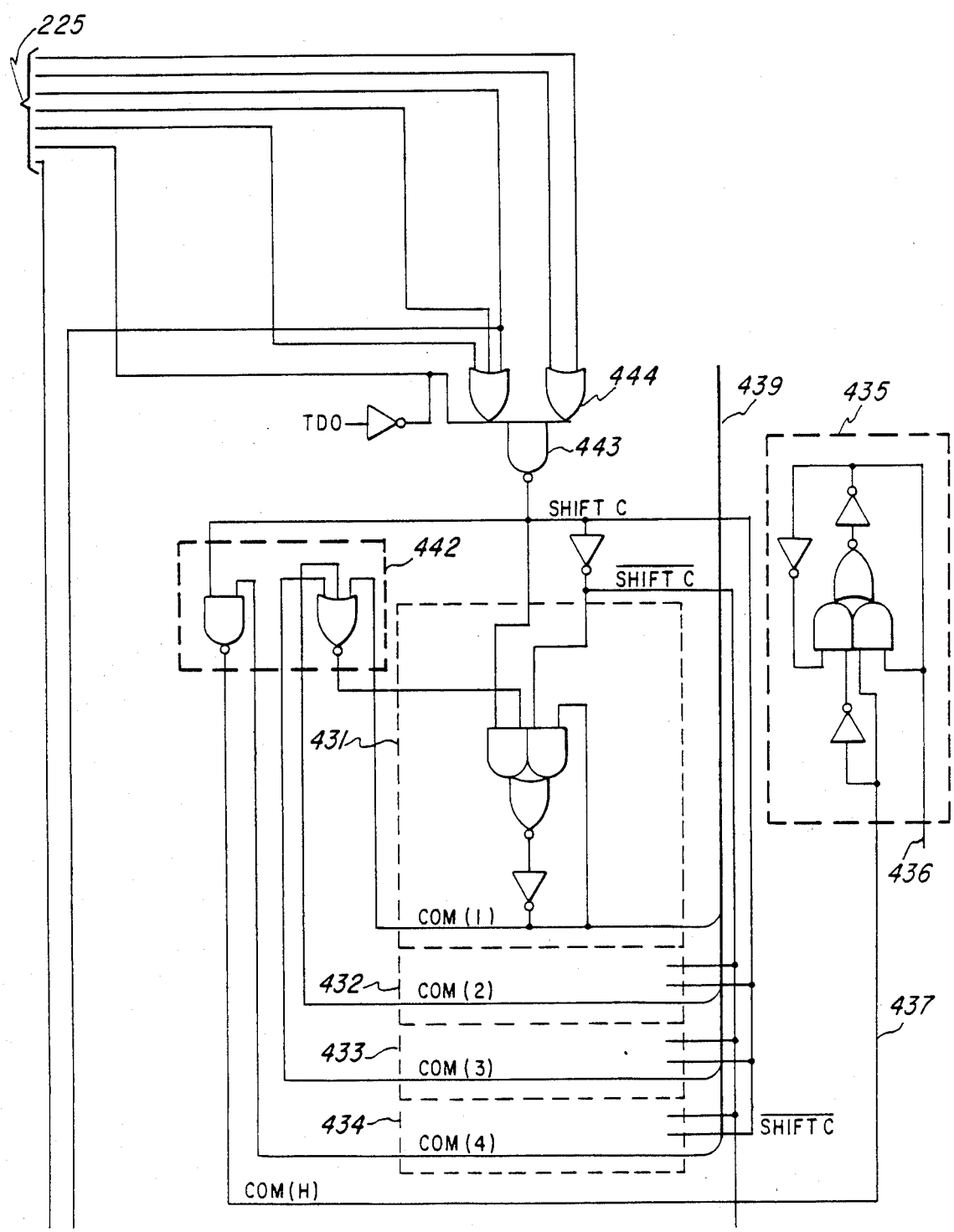

The common time generator circuitry is illustrated in FIG. 22. The circuitry shown 440 is a ring counter which provides timing to gate 443 which also receives inputs from gate 444 and TDO. SHIFTC will increment the common time generator 400 if any of the three inputs are active on gate 443. The output of gate 443 is used to shift the output of the four common time latches 431, 432 and 433 and 434. The outputs of these latches represent the common time period. When updating the display, the TDO instruction must be active for four instruction cycles for all the four common latches, 431 through 434, to be activated. The output of these common latches is line 439 the common time output and 438, SHIFT C— indicating that the common latches are not being shifted. In addition, circuitry 435 is provided as a polarity generator. Circuitry 435 contains a divide by 2 counter which receives timing signals from the timing circuitry 442 as shown. When displaying in the fast frequency mode, the number of instruction cycles per SHIFT C pulse must be increased to maintain the same display frequency. (Circuitry 950 contains a divide by 127 counter.) In the fast frequency mode, gate 444 is used to pulse SHIFT C every 127 instruction cycles.

Figure 23A:
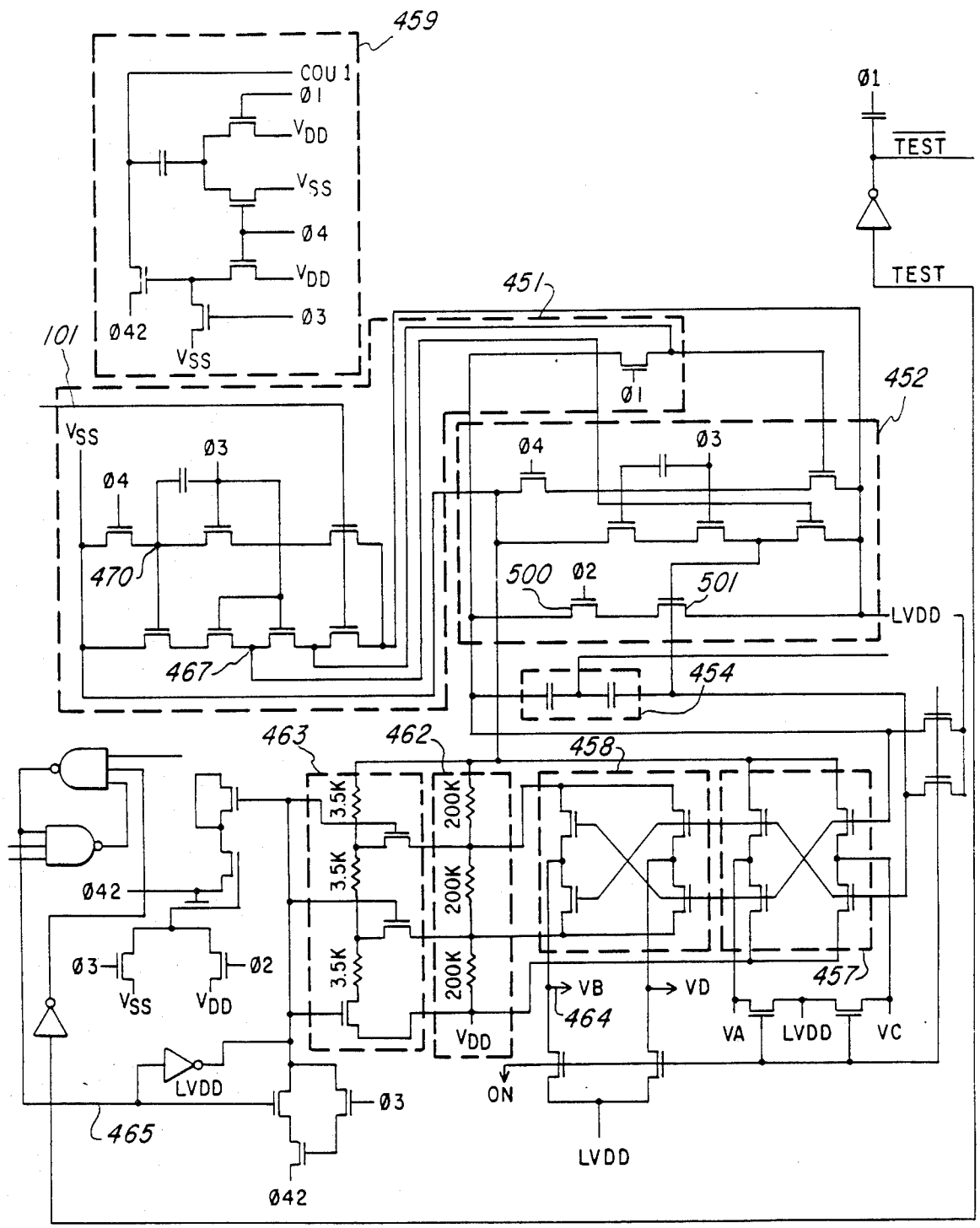
FIG. 23 is a schematic diagram of the resistor divider and of the common buffers.
Figure 23B:
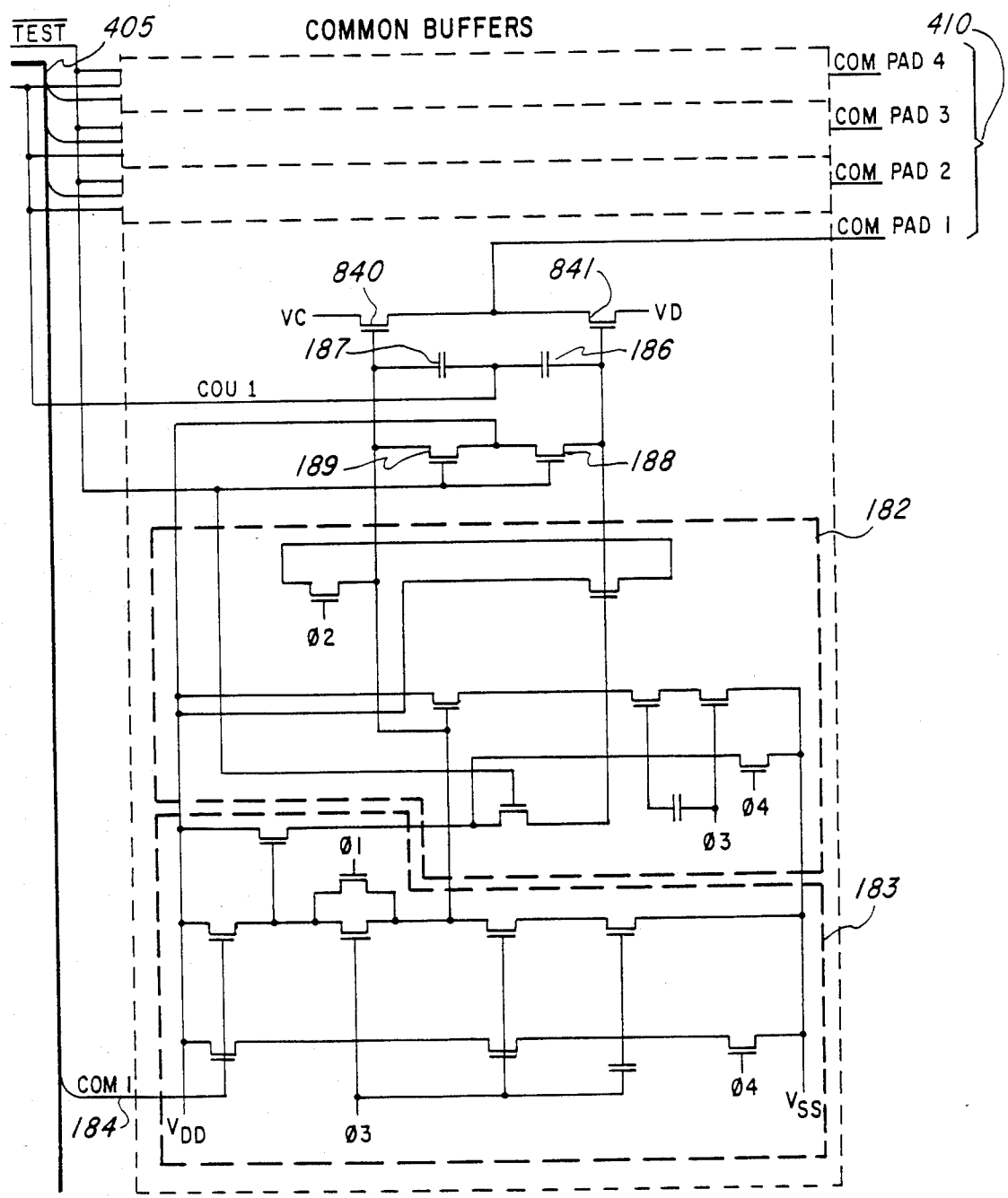

The resistor divider circuitry and common buffer circuitry are illustrated in FIG. 23. The resistor divider circuitry receives the polarity signal from the common time generator 400 via line 101. This signal is input into the first of two buffers, 451 and 452 which provide an output to the remainder of the resistor divider circuitry without precharge. These buffers are two inverter circuits similar to the inverter as shown in FIG. 4A connected in series. The capacitor pair 454 receives an input from the circuitry 459. The capacitors 454 are used to supplement the output of the buffers 451 and 452 that is inputted into the cross latches 457 and 458. Cross latch 457 produces VA and VC. Cross latch 458 produces VD and VB. VA and VB are used by the select lines. VC and VD are used by the common lines. Note that the capacitors 454 and the output of the buffers 452 and 451 drive these matrix switches with a voltage that is greater than a negative power supply. The capability allows the circuitry to use a power supply of a lower voltage than is normally required by a PMOS or NMOS circuit. The output of these matrix switches 457 and 458 inputs to the divider networks 463 and 462 to provide a low and high impedance interface, respectively. The low impedance interface 463 is provided during the first instruction cycle when the power transfer is required. The high impedance circuitry 462 is switched on during the remaining three instructions cycles for maintenance of the power signal. Line 465 provides a pulse to connect the low impedance circuitry 463 during the first instruction cycle.

The common buffers 408 are also illustrated in FIG. 23. The buffers receive their signal from the common time generator 400 via line 405. This signal is buffered through two buffers sections 182 and 183 which are similar to the inverter circuitry in FIG. 4A. The output of these inverters drives devices 840 and 841. The output of inverters 182 and 183 is supplemented by capacitors 186 and 187 which receive charge from COU1. This supplemental signal is used to switch devices 840 and 841. Capacitors 187 and 186 receive additional charge from the COU 1 circuitry 459 to provide the devices 840 and 841 with a signal that is in excess of the magnitude of Vss. The four common lines shown as 410 then output the respective Vc or Vd line as determined by the common buffer 408 and resistor divider 402. The common buffers for common pads 2 through 4 are similar to the common buffer shown.

Figure 24A:
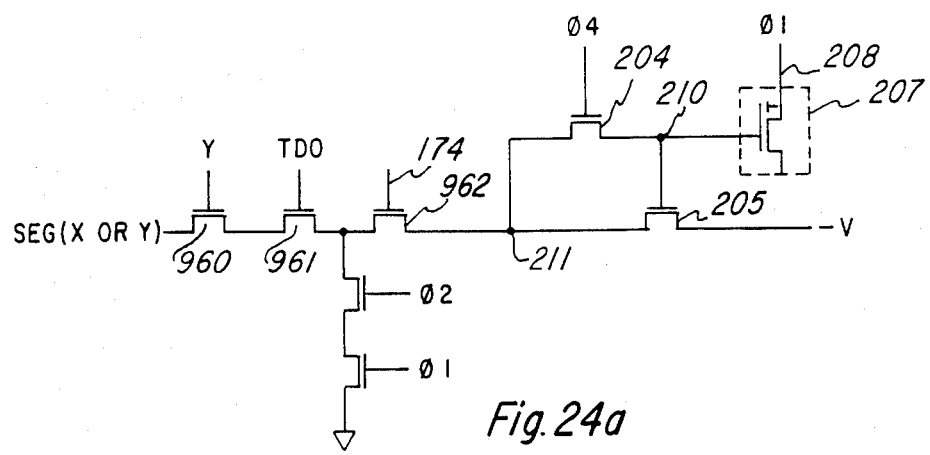
FIG. 24a is a schematic diagram of the random access memory cell contained in the display RAM.
Figure 24B:
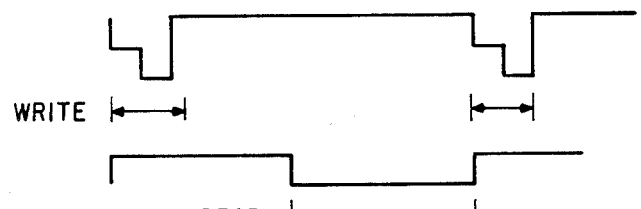
FIG. 24b is a timing diagram of the display random access memory cell.
Figure 24D:
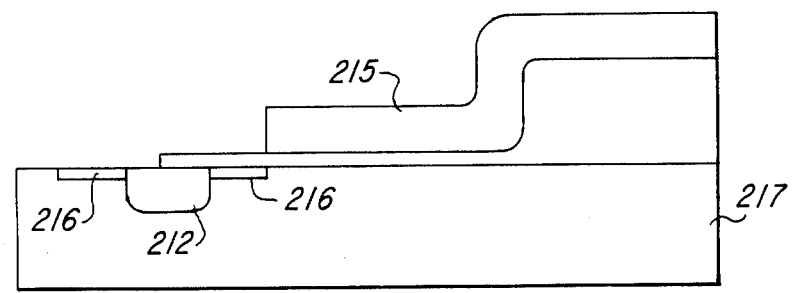
FIG. 24d is an illustration of a cross section of the RAM cell illustrated in FIG. 24c.
Figure 24C:
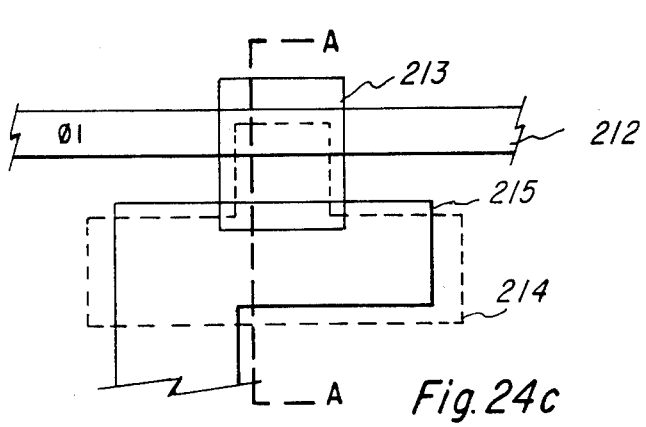
FIG. 24c is an illustration of the display RAM cell structure.
Figure 25A:
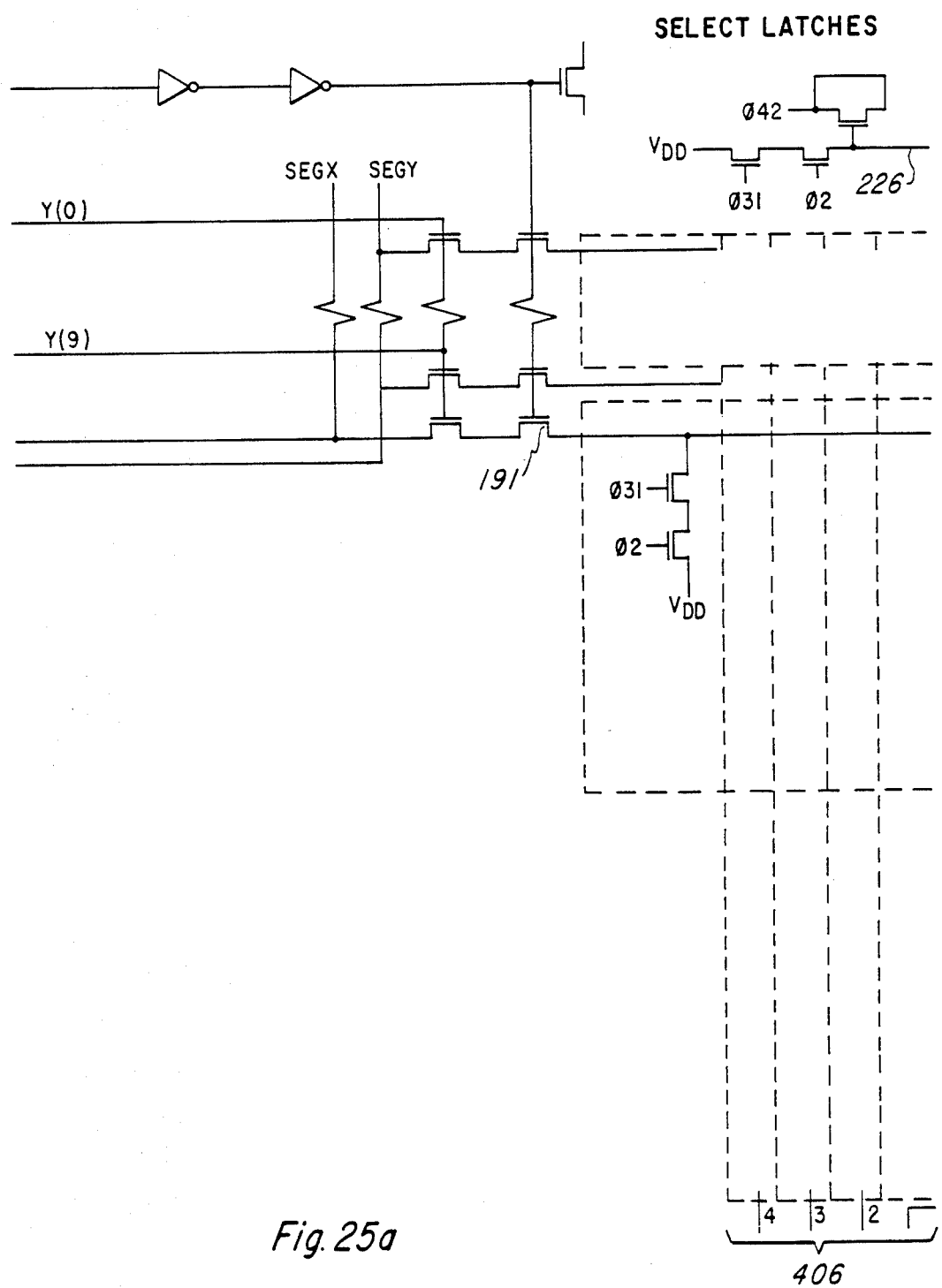
FIG. 25 is a schematic diagram of the display RAM and the segment buffers.
Figure 25B:
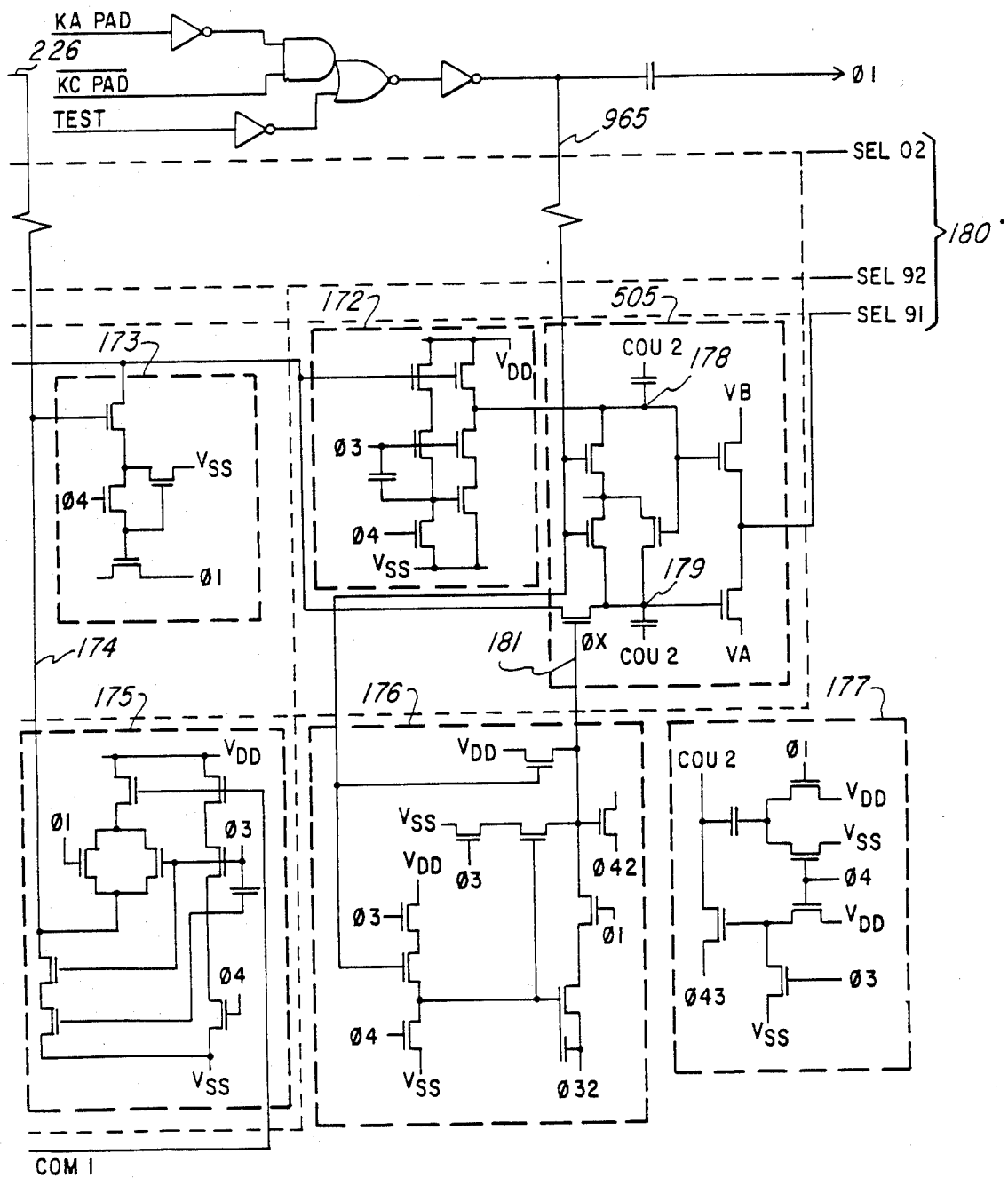

FIG. 24A is a schematic diagram of the RAM cell for the display RAM 414. The RAM cell receives an input from either SEG(X) or SEG(Y) through device 960 controlled by an address and device 961 controlled by the TDO instruction and device 962 controlled by line 174 from inverter 175 (see FIG. 25) with inputs from the common time generator 400. The RAM cell is of a three transistor type but includes a gated capacitor device shown as 207. Phi 2 and Phi 31 are used to precharge the I/O line positive. At the beginning of the refresh cylce, phi 1 and phi 4 are at ground. Then phi 1 goes to $-V$. If node 210 is negative (for storage of a "0") so that the gated capacitor 207 is on, node 210 is coupled to a voltage of magnitude greater than the voltage supplied by the negative power supply. The gate drive on device 205 is sufficient to change 211 to $-v$. Then phi 1 goes to ground and phi 4 goes to a voltage of magnitude greater than the voltage supplied by the negative power supply. Node 211 is charge shared with node 210. If node 210 has lost voltage due to leakage, the voltage level will be refreshed.

if a "1" is stored in the cell, gated capacitor 207 will not turn on and node 210 will not be coupled to a negative voltage. Device 205 will not turn on and nodes 210 and 211 will remain at ground. Nodal leakage on nodes 210 and 211 will keep them at ground potential. The timing for the RAM bit is shown in FIG. 24b. FIG. 24c illustrates the fabrication of the gated capacitor device 207. Notice that Phi 1 is received by a diffusion 212. Adjacent to the diffusion 212 is a thin oxide layer 214 which intersects 212 and is placed underneath the metal junction of node 210 marked in the fabrication drawing of FIG. 24c as 215. A self-aligned implant is placed in a pattern 213 as shown. It is desired to have this implant be adjacent to the metal plate 215 without being implanted underneath the plate 215. Since 215 is metal there will be no lateral diffusion underneath 215 and the desired results will be achieved. The display RAM 414 and select buffer 411 are illustrated in FIG. 25. The RAM cell discussed in FIG. 24 is shown as circuitry 173 in FIG. 25. This RAM cell is addressed by line 174 from circuitry 175 which receives an input from the common lines 406 as previously discussed. The RAM cell receives inputs from segment X line 415 and segment Y line 416 as previously discussed in addition to the reception of the TDO signal in device 191 as shown in FIG. 25. The contents then are outputted into the select buffers shown as circuitry 505. The output buffer 505 also receives charge from capacitors 178 and 179 which in turn receive a timing signal COU 2 from circuitry 177. The purpose of this additional charge is to drive the output of buffer 505 pass the negative power supply value. As previously mentioned, this technique allows the use of a lower magnitude power supply. The output of the select buffers is shown as lines 180 which are connected directly to the liquid crystal display devices. Additional circuitry 176 is shown that generates the signal phi X on line 181. Phi X is provided to transfer data from the segment RAM 173 to the output buffer 505. Line 965 is used to float the display during test mode. FIG. 24d illustrates a cross section of the portion of the RAM cell illustrated in FIG. 24c. Note that the substrate 217 contains the gap 216 that acts as a link between the diffusion 212 and the metal gate 215.

Figures 1A, 1B:
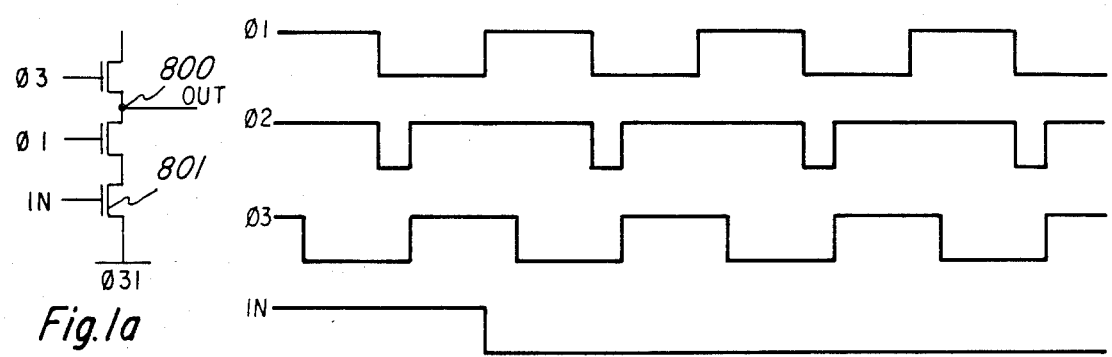
FIG. 1a is a schematic diagram of precharge/discharge logic.
FIG. 1b is a timing diagram for precharge/discharge logic.
Figure 2:
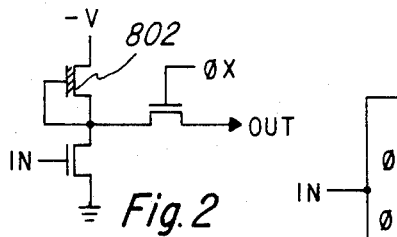
FIG. 2 is a schematic diagram of a static inverter.
Figure 3:
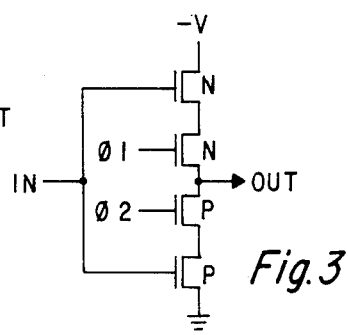
FIG. 3 is a schematic diagram of a complementary MOS inverter.
Figure 26:
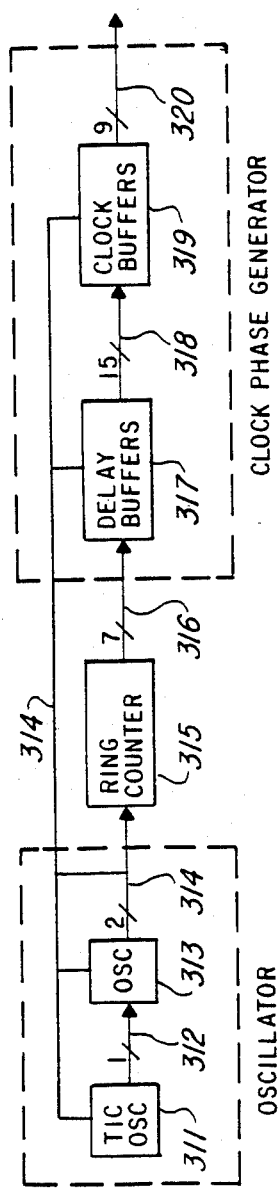
FIG. 26 is a block diagram of the oscillator and clock phase generator.
Figure 27:
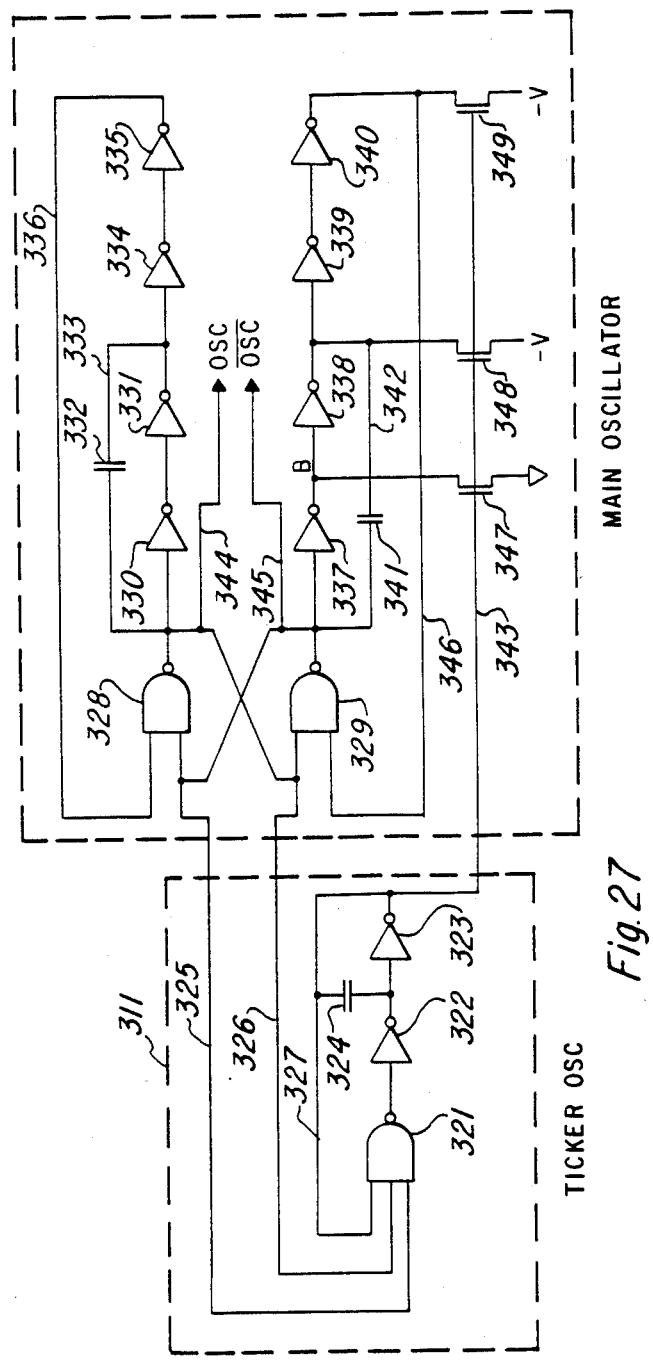
FIG. 27 is a logic diagram of the oscillator.
Figure 28A:
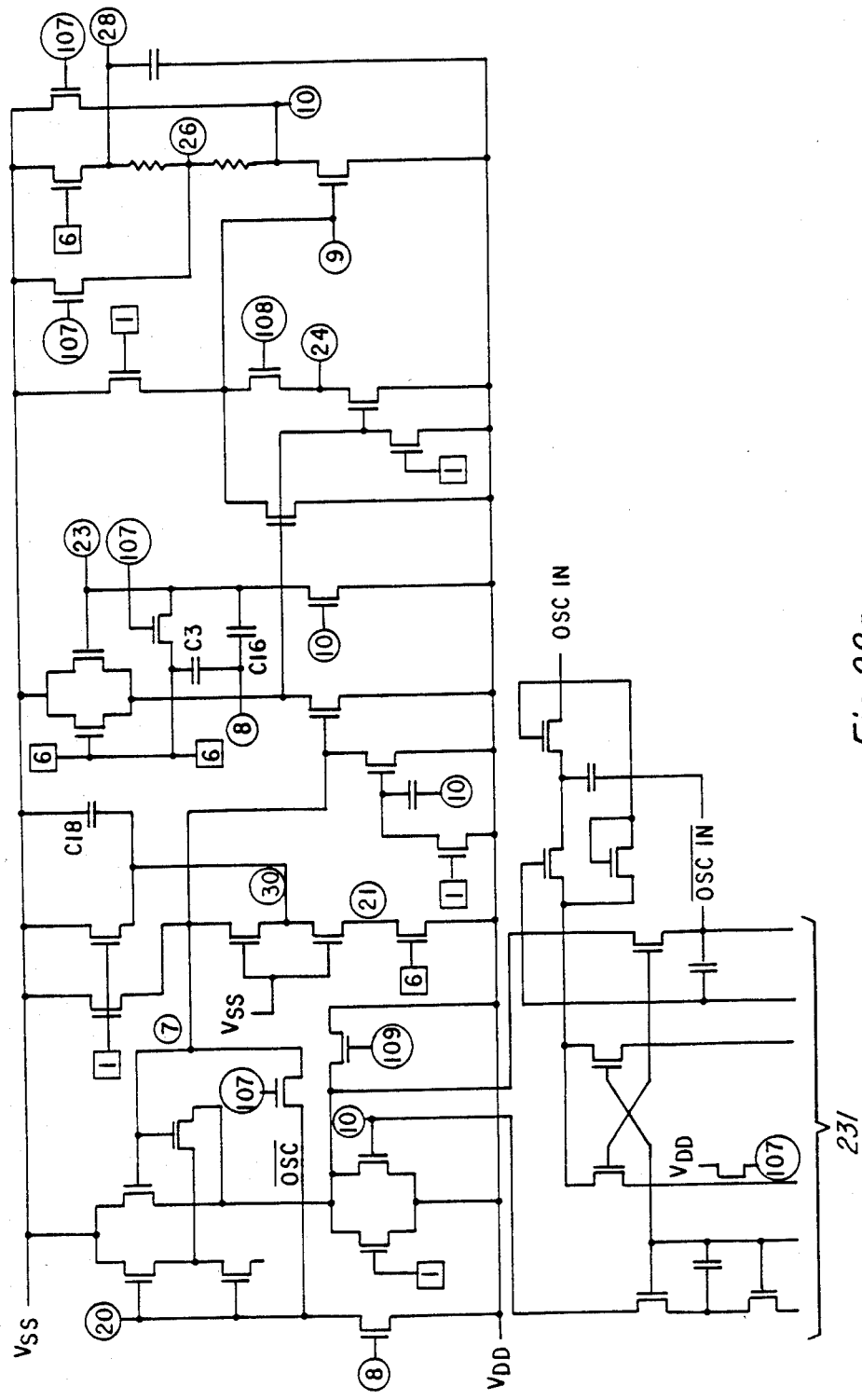
FIG. 28 is a schematic diagram of the oscillator.
Figure 28B:
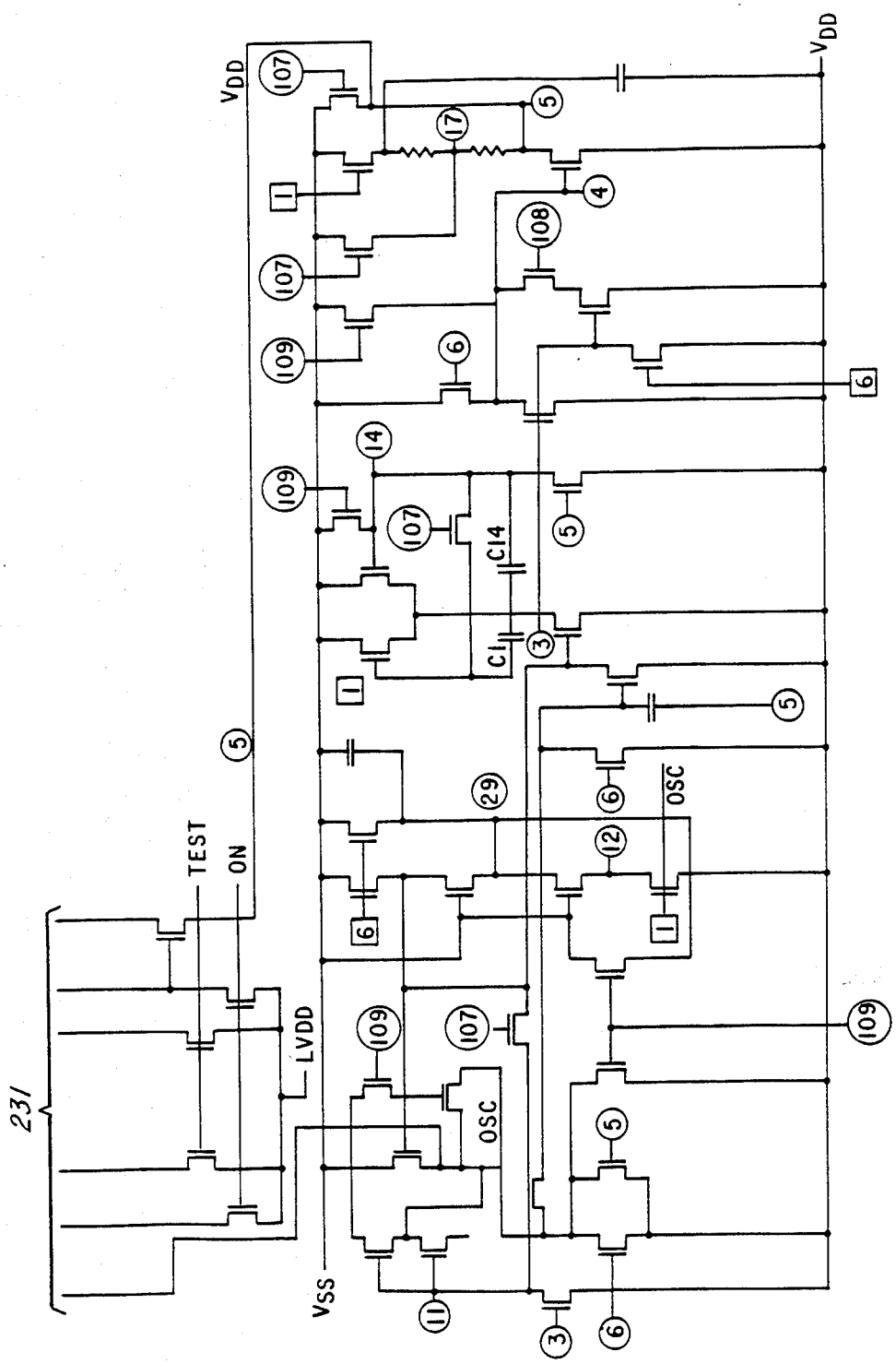

FIG. 26 is a block diagram of the clock generator circuitry. Block 311 represents a tickler oscillator which starts the oscillator 313 via line 312. Oscillator 313 then outputs two oscillator signals to the ring counter 315 which then outputs timing signals on line 316 to the display buffers 317. The delay buffers provide 15 signals on lines 318 to the clock buffers as shown. Nine clock signals are output on lines 320. The logic diagram of the oscillator circuit and tickler circuit is shown in FIG. 27. Block 311 contains logic for the tickler oscillator which contains a static NAND gate 321 connected to two static converters 322 and 323. Note that capacitor 324 is connected from the output of inverter 322 to the input of the static NAND gate 321. This capacitor adds charge to the output of device 323 to drive device in the main oscillator 347, 348 and 349. This technique as previously discussed is called "bootstrapping" or driving the value to a voltage that is greater than the negative power supply. The purpose of the tickler oscillator is to start the oscillator 313 upon power up. Oscillator 313 is illustrated as two loops of inverters connected with NAND gates that are cross coupled. Note that capacitors 332 and 341 are provided in these inverter loops to provide extra charge for the oscillator outputs at 344 and 345. Inverters 330, 334, and 338 are gated by OSC—. Inverters 331, 337 and 339 are gated by OSC. Inverters 335 and 340 are similar to the static inverters as illustrated in FIG. 2. NAND gates 328 and 329 gated by Signal A and Signal B, respectively.

Figure 29A:
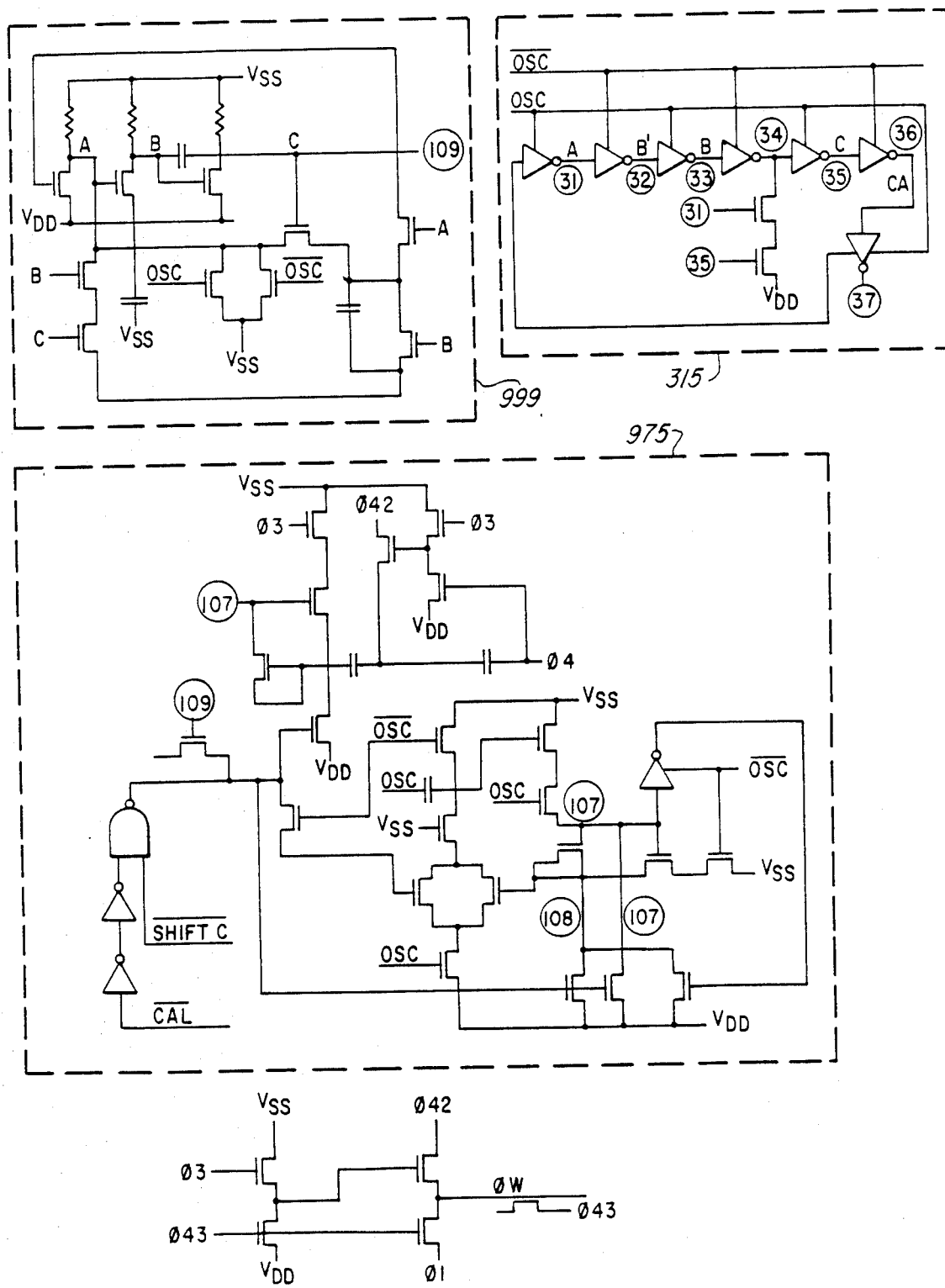
FIG. 29a is a schematic diagram of the ring counter, tickler oscillator and high/flow frequency circuitry.
Figure 30:
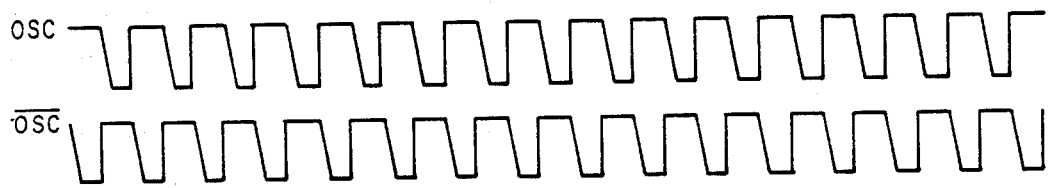
FIG. 30 is a timing diagram for the oscillator output.
Figure 31:
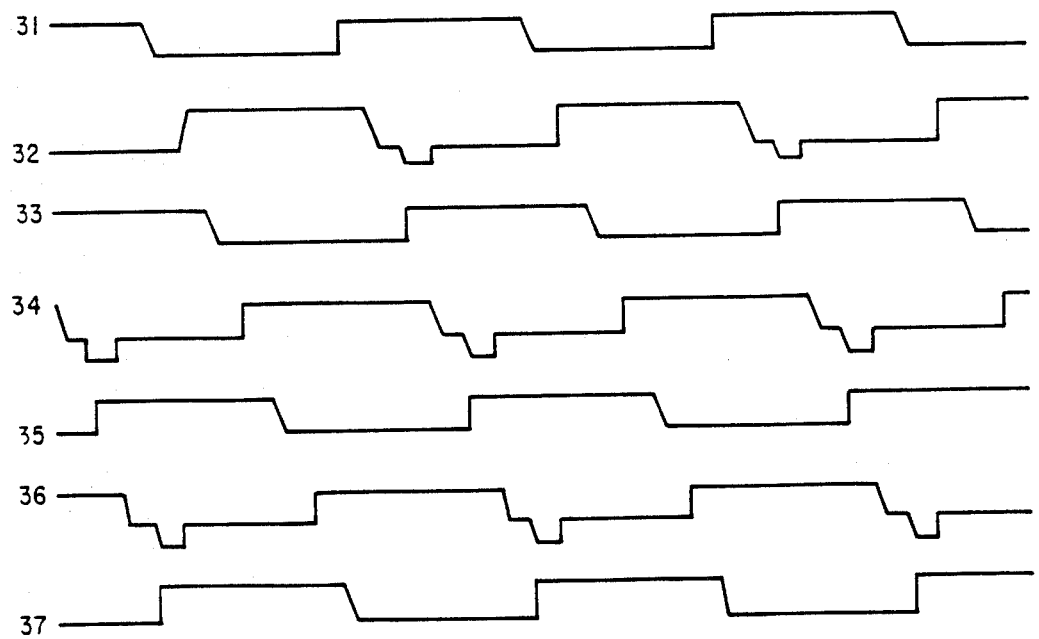
FIG. 31 is a timing diagram for the ring counter output.
Figure 32:
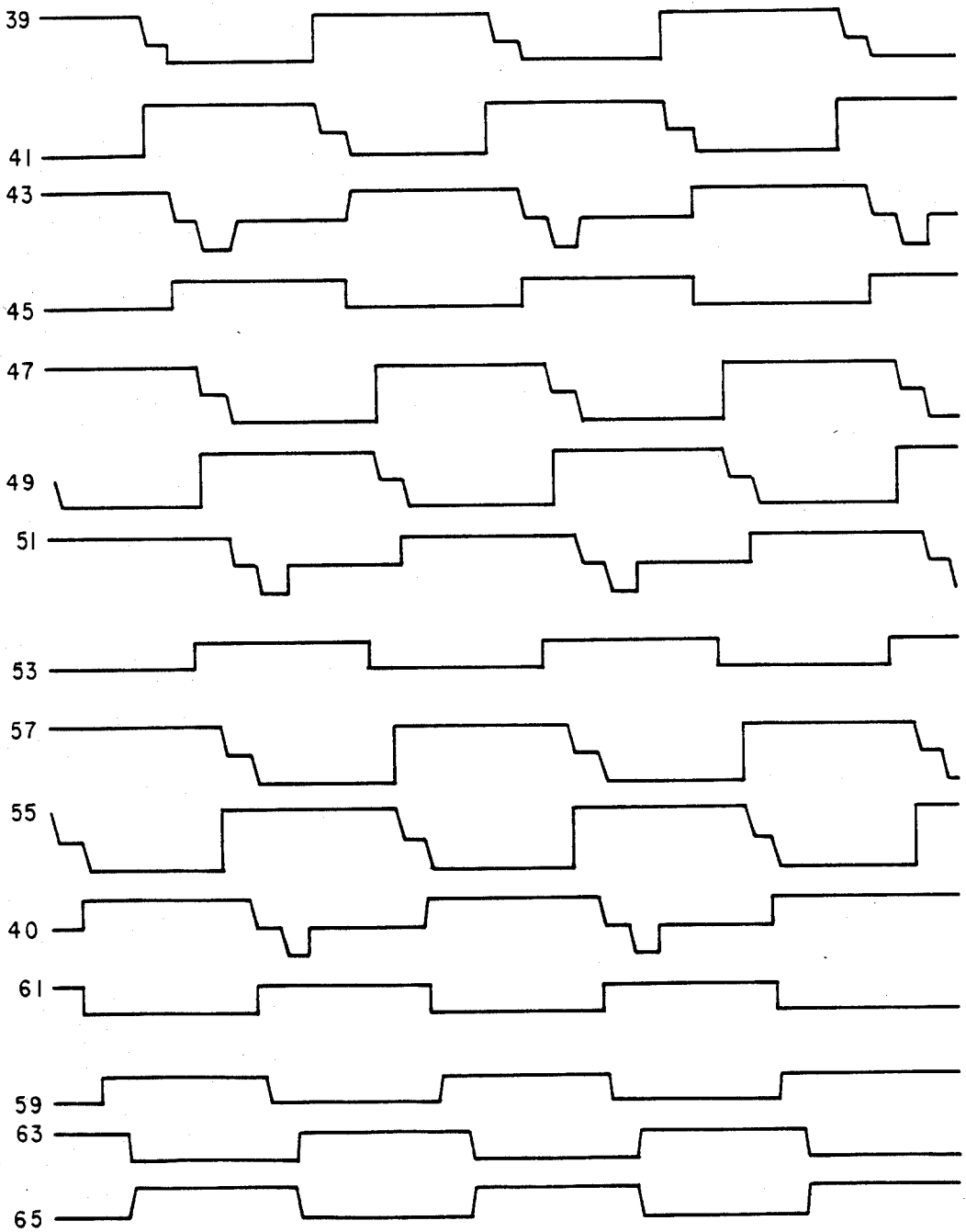
FIG. 32 is a timing diagram of the delay buffer output.
Figure 33:
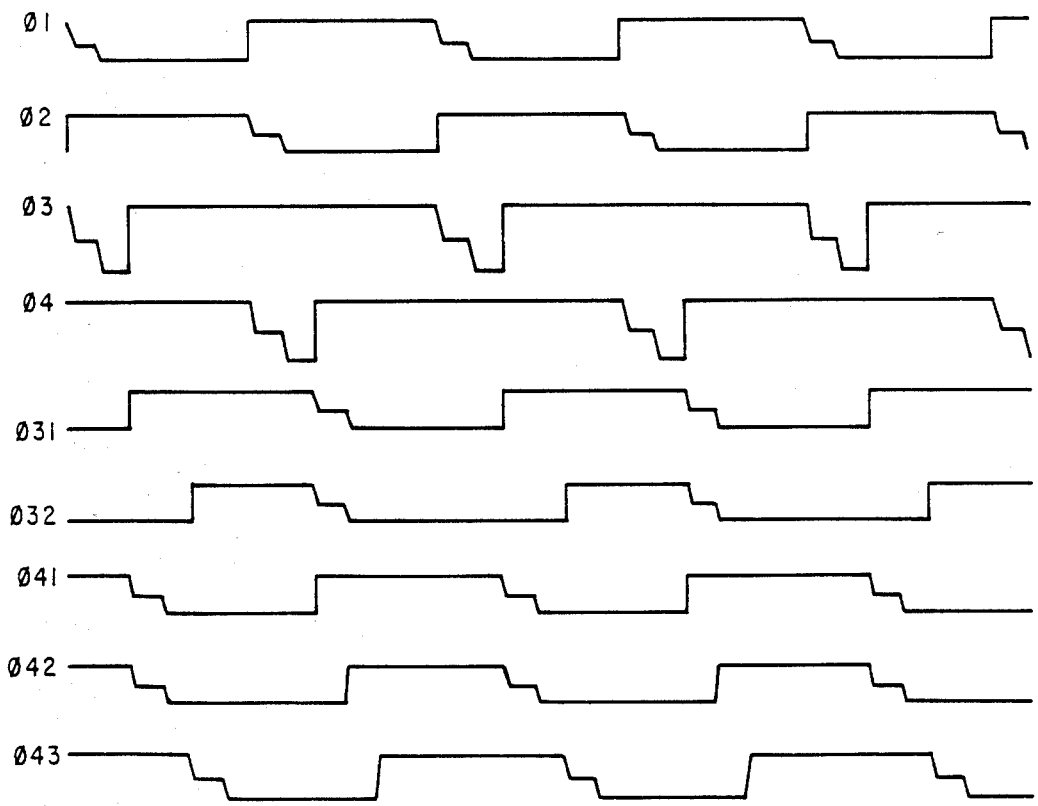
FIG. 33 is a timing diagram for the clock buffer output.

FIG. 29a contains a schematic diagram of the ring cunter 315 as shown. The circles numbers 31, 32, 33, 34, 35 and 36 represent signals at those particular node points. These numbers are used elsewhere in the delayed buffer circuitry 317 (in FIG. 26) to produce signals for the clock buffers. The timing diagram for the oscillator 313 input into the ring counter 315 is shown in FIG. 30. The timing diagram for the output of the ring counter 315 is shown in FIG. 31. Note that the numbers for the waveforms correspond to the specific nodes as shown in 315 in FIG. 29. Whenever a display is being updated, circuit 975 selects the fast frequency operation in order to more quickly provide the bootstrapped voltage to the display output. Circuit 975 also selects fast frequency operation when CAL— (provided by the user) is active. Also illustrated in the schematic 999 of the tickler oscillator 311 (FIG. 26).

Figure 29B:
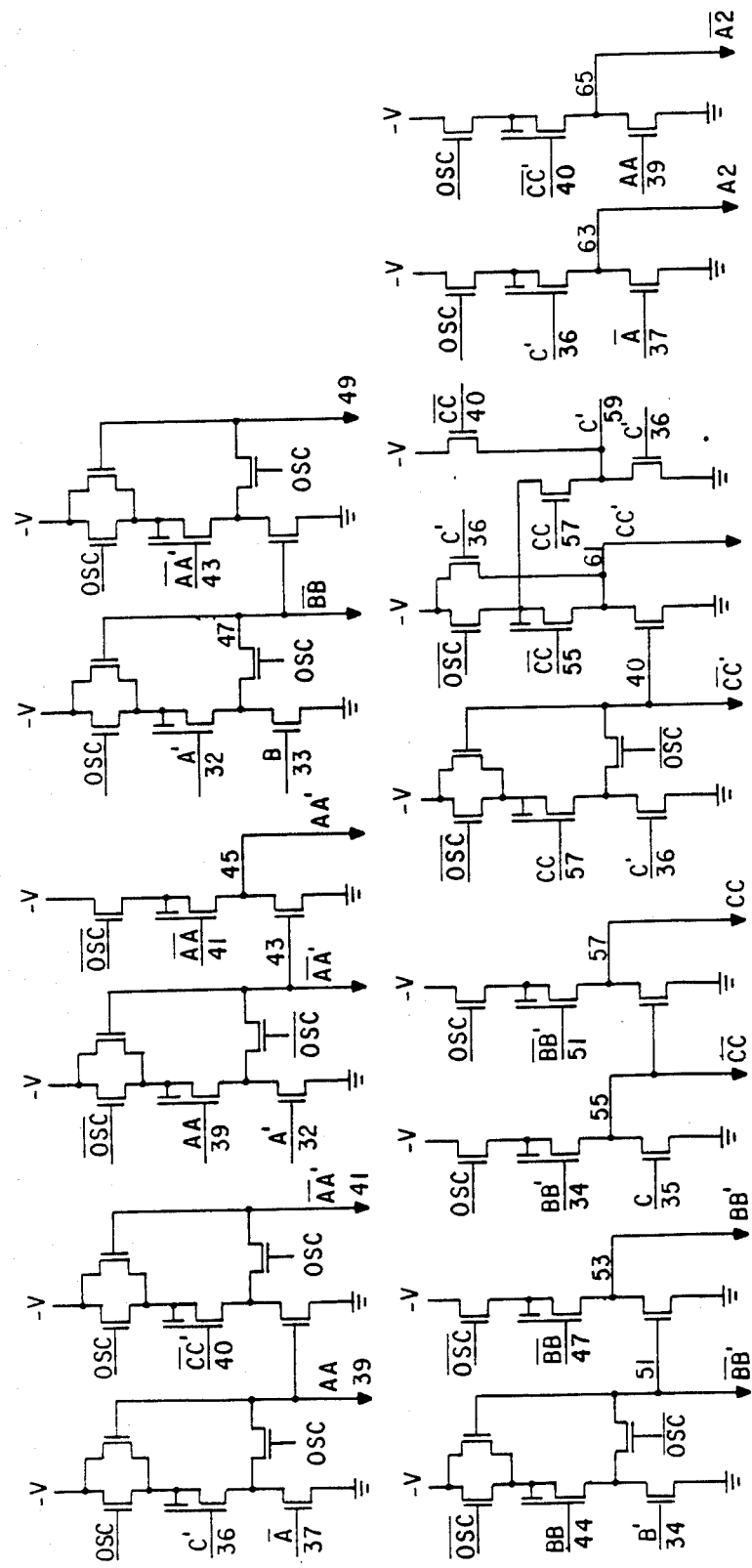
FIG. 29b is a schematic diagram of the delay buffers.

The delay buffers 317 are shown in schematic form in FIG. 29b. Note that the signal input numbers and output numbers match the respective timing diagram illustrated in FIG. 31. The purpose of the delay buffers 317 is to provide signals which are logically the same as the output of the ring counter 315 but their outputs are "bootstrapped" below the negative supply voltage by use of gated capacitors as shown. These signals are used to drive the clock buffers in FIG. 29c.

Figure 29C:
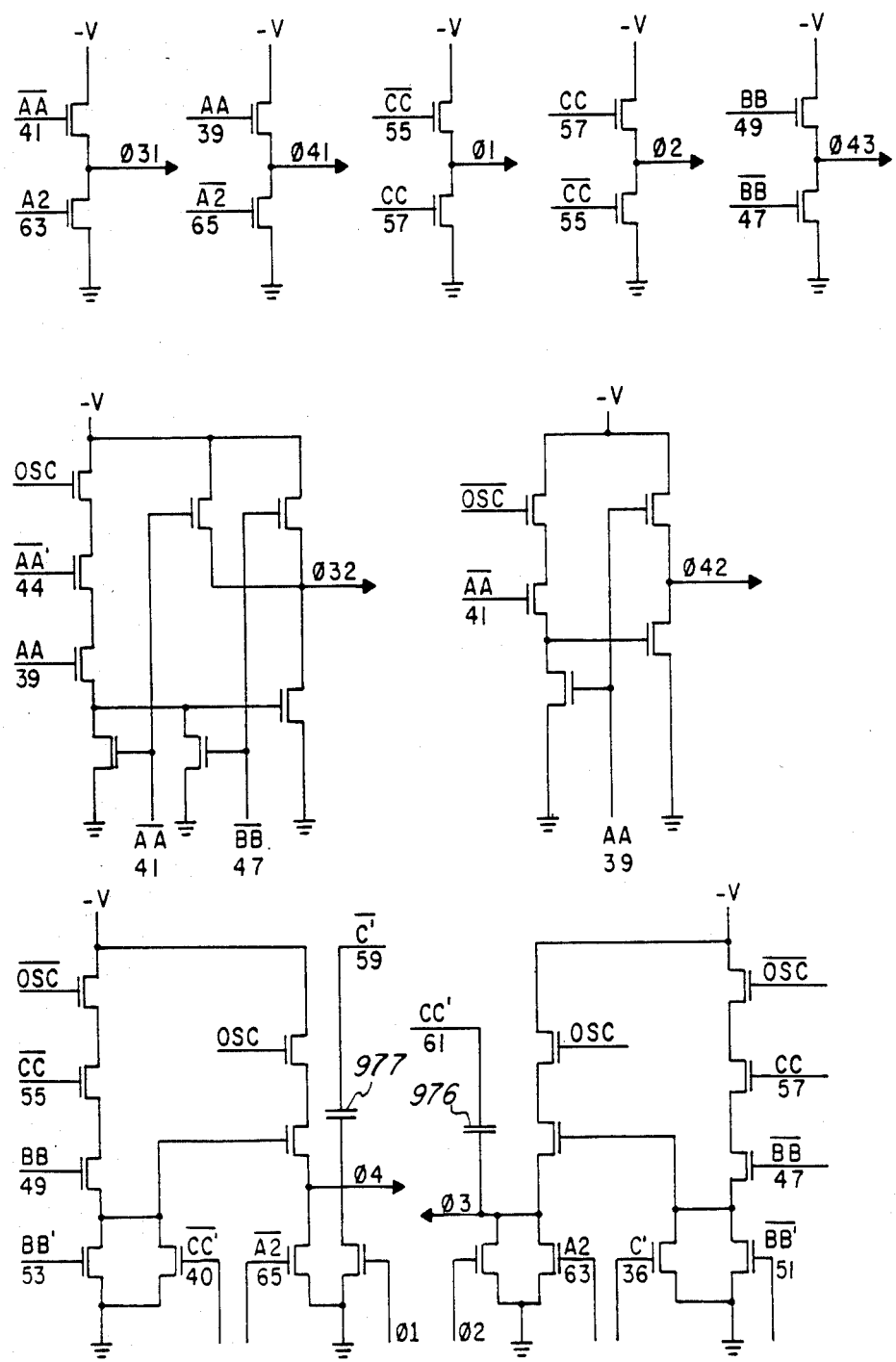
FIG. 29c is a schematic diagram of the clock buffers.

The schematics for the clock buffers 319 are shown in FIG. 29c. These buffers are push-pull circuits. Phi 3 and phi 4 are "bootstrapped" below the negative power supply voltage by the capacitors 976 and 977, respectively.

Figure 34:
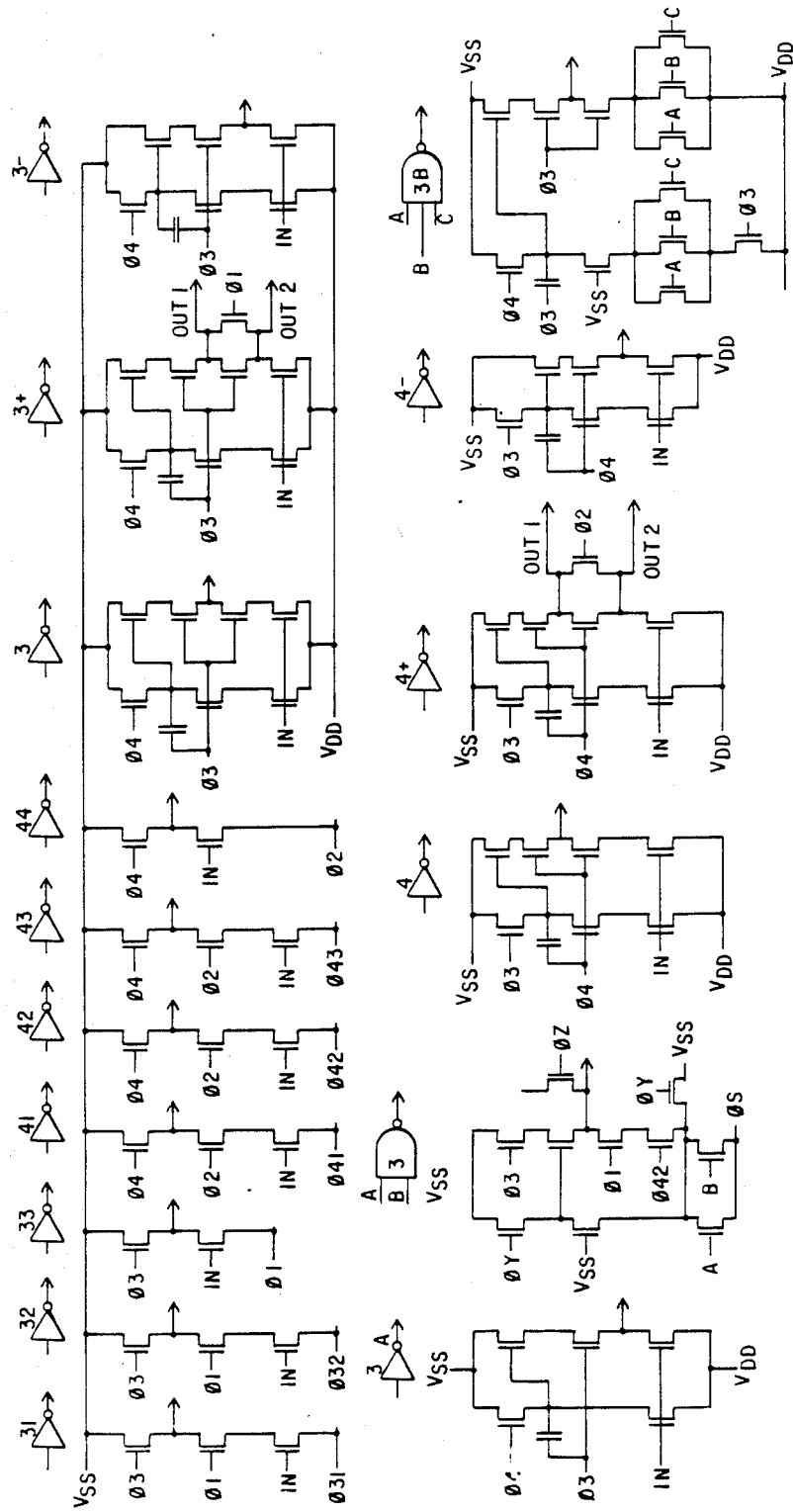
FIG. 34 is a schematic diagram of logic types used in the preceding figures.

FIG. 34 contains schematic diagrams of different logic types are used in the preceding schematic figures. Many of these figures are similar to the low power inverter illustrated in FIG. 4.

What we claim is:

1. A memory cell comprising:
    a bit line for conducting data to the memory cell;
    a gated capacitor device for storing data from the bit line and having a first terminal connect to a first node and a second terminal connected to a first refresh line;
    a first transistor with a first terminal connected to said first node, a second terminal connected to a second node and the bit line and a third terminal connected to a second refresh line;
    a second transistor with a first terminal connected to a power line, a second terminal connected to said second node and a third terminal connected to said first node; first means for providing a first reset refresh signal on said first refresh line; and
    second means for providing a second refresh signal of a voltage magnitude greater than the voltage on said power line provided on said second refresh line.

2. A memory cell according to claim 1, wherein the first refresh signal indicates a read.

3. A memory cell according to claim 2, wherein said second refresh signal indicates a write.

4. A memory cell according to claim 1, wherein said cell is fabricated with metal oxide semiconductor devices.

5. A memory cell according to claim 1, wherein said second refresh signal occurs mutually exclusive of the occurrence of said first refresh signal.

6. A memory cell comprising:
    a bit line for conducting data to the memory cell;
    a gated capacitor device for storing data from the bit line and having a first terminal connected to a first node and a second terminal connected to a first refresh line;
    a first transistor with a first terminal connected to said first node, a second terminal connected to a second node and the bit line and a third terminal connected to a second refresh line;
    a second transistor with a first terminal connected to a power line, a second terminal connected to said second node and a third terminal connected to said first node;
    said bit line addressed by address signals of a voltage magnitude greater than the voltage provided by said power line to obtain data stored in the gated capacitor device.

7. A memory cell comprising:
    a bit line for conducting data to the memory cell;
    a gated capacitor device for storing data obtained from a bit line and having a first terminal connected to a first node and a second terminal connected to a first refresh line, said gated capacitor including a region of a first polarity located in a semiconductor substrate of opposite polarity, a layer of silicon dioxide located upon said region and upon an area adjacent to said region, a metal layer located on top of said silicon dioxide layer and adjacent to a gap, and said gap of first polarity located in said semiconductor substrate and adjacent to said region;

a first transistor with a first terminal connected to said first node, a second terminal connected to a second node and the bit line and a third terminal connected to a second refresh line; and a second transistor with a first terminal connected to a power line, a second terminal connected to said second node and a third terminal connected to said first node.

8. A memory cell according to claim 7, wherein said bit line is addressed by address signals of a voltage magnitude greater than the voltage provided by said power line.

* * * * *